US012660494B2

(12) United States Patent
Choi et al.

(10) Patent No.: US 12,660,494 B2
(45) Date of Patent: Jun. 16, 2026

(54) SUBSTRATE, DISPLAY PANEL AND DISPLAY DEVICE COMPRISING THE SAME

(71) Applicant: LG DISPLAY CO., LTD., Seoul (KR)

(72) Inventors: Seulgi Choi, Gyeonggi-do (KR); Nam Ki, Seoul (KR); Eunsoo Chang, Seoul (KR)

(73) Assignee: LG Display Co., Ltd (KR)

( * ) Notice: Subject to any disclaimer, the term of this patent is extended or adjusted under 35 U.S.C. 154(b) by 586 days.

(21) Appl. No.: 17/944,337

(22) Filed: Sep. 14, 2022

(65) Prior Publication Data

US 2023/0083578 A1 Mar. 16, 2023

(30) Foreign Application Priority Data

Sep. 15, 2021 (KR) ........................ 10-2021-0123365

(51) Int. Cl.
H10K 77/10 (2023.01)
G09G 3/3233 (2016.01)
(Continued)

(52) U.S. Cl.
CPC ......... H10K 77/111 (2023.02); G09G 3/3233 (2013.01); H10K 59/124 (2023.02);
(Continued)

(58) Field of Classification Search
CPC ...... H10K 77/10; H10K 77/111; H10K 59/10; H10K 59/124; H10K 59/126; H10K 59/13; H10K 59/131; H10K 59/30; H10K 59/35; H10K 59/353; H10K 59/40; H10K 59/60; H10K 59/65; H10K 59/8051; H10K 59/8052; H10K 2102/311; H10K 59/82;
(Continued)

(56) References Cited

U.S. PATENT DOCUMENTS

2017/0121564 A1* 5/2017 Cho ...................... H10K 85/141
2019/0296266 A1* 9/2019 Kim ........................ H05K 1/147
(Continued)

FOREIGN PATENT DOCUMENTS

CN 110299381 A 10/2019
CN 110556404 A 12/2019
(Continued)

OTHER PUBLICATIONS

Chen, Flexible Substrate And Preparation Method Thereof, OLED Display Panel, 2020, machine translation of CN 111584740 A, pp. 1-7. (Year: 2020).*
(Continued)

*Primary Examiner* — Natalia A Gondarenko
(74) *Attorney, Agent, or Firm* — Fish & Richardson P.C.

(57) ABSTRACT

A display panel including a first optical electronic device located under, at a lower portion of, the display panel and overlapping with at least a portion of a first optical area included in a display area, a first substrate disposed in at least a portion of a non-optical area, a second substrate disposed on the first substrate, a third substrate disposed in the first optical area and having a transmittance higher than the first substrate and the second substrate, and a bonding layer disposed on at least one surface of the third substrate, and a display device including the display panel.

18 Claims, 23 Drawing Sheets

(51) Int. Cl.

| | |
|---|---|
| *H10K 59/124* | (2023.01) |
| *H10K 59/131* | (2023.01) |
| *H10K 59/40* | (2023.01) |
| *H10K 102/00* | (2023.01) |

(52) U.S. Cl.

CPC ... *H10K 59/131* (2023.02); *G09G 2300/0842* (2013.01); *G09G 2354/00* (2013.01); *H10K 59/40* (2023.02); *H10K 2102/311* (2023.02)

(58) Field of Classification Search

CPC .. H10K 59/87; H10K 59/871; H10K 59/8722; H10K 59/873; H10K 59/8731; G09G 3/3233; G09G 2300/0842; G09G 2354/00; H10H 29/012; H10H 29/0362; H10H 29/0363; H10H 29/24; H10H 29/30; H10H 29/32; H10H 29/352; H10H 29/37; H10H 29/39; H10H 29/41; H10H 29/49; H10H 29/832; H10H 29/8323; H10H 29/852; H10H 29/953

USPC ...................................... 257/103, 40

See application file for complete search history.

(56) References Cited

U.S. PATENT DOCUMENTS

| | | | | |
|---|---|---|---|---|
| 2020/0106057 | A1* | 4/2020 | Yoo | ....................... G09G 3/3225 |
| 2021/0005687 | A1* | 1/2021 | Jeon | ..................... H10K 59/122 |
| 2021/0028252 | A1* | 1/2021 | Hong | ................... H10K 59/126 |
| 2021/0118961 | A1* | 4/2021 | Lee | ........................ H10K 59/88 |
| 2021/0126077 | A1* | 4/2021 | Chae | ................... H10K 59/126 |
| 2021/0408173 | A1* | 12/2021 | Zhang | ................... H10K 59/65 |
| 2022/0050986 | A1* | 2/2022 | Jo | .......................... H10K 59/40 |
| 2022/0271257 | A1* | 8/2022 | Won | ....................... H10K 59/40 |
| 2022/0310972 | A1* | 9/2022 | Park | ...................... H10K 71/00 |

FOREIGN PATENT DOCUMENTS

| | | | | | |
|---|---|---|---|---|---|
| CN | 110970471 | A | | 4/2020 | |
| CN | 111584740 | A * | 8/2020 | ............ G09F 9/301 |
| CN | 112992985 | A | | 6/2021 | |
| KR | 20170087635 | A | | 7/2017 | |
| KR | 20180054139 | A | | 5/2018 | |
| KR | 20190112223 | A | | 10/2019 | |
| KR | 20200036994 | A | | 4/2020 | |
| KR | 20200045904 | A | | 5/2020 | |
| KR | 20200057868 | A | | 5/2020 | |
| KR | 20210003363 | A | | 1/2021 | |

OTHER PUBLICATIONS

Office Action in Korean Appln. No. 10-2021-0123365, mailed on Sep. 29, 2025, 22 pages (with English translation).

Office Action in Chinese Appln. No. 202211121031.3, mailed on Apr. 10, 2026, 17 pages (with English translation).

* cited by examiner

*Front View*        *Side View*

Left Side View         Front View         Right Side View

Left Side View          Front View          Right Side View

FIG.18

| Substrate type | Comparative Example 1 | | | Comparative Example 2 | | | Embodiment | |
|---|---|---|---|---|---|---|---|---|
| Substrate thickness(μm) | 16 | 10 | 6 | 16 | 10 | 6 | 500 | 100 |
| Wavelength 430nm | 3.1% | 4.8% | 6.3% | 6.1% | 7.3% | 8.3% | 15.9% | 15.9% |
| 470nm | 7.6% | 9.9% | 11.1% | 11.5% | 11.8% | 12.0% | 16.2% | 16.2% |
| 555nm | 16.6% | 18.4% | 18.8% | 19.0% | 19.0% | 19.0% | 12.6% | 12.6% |
| 650nm | 18.3% | 19.3% | 19.3% | 19.9% | 20.1% | 20.1% | 21.7% | 21.7% |

SUBSTRATE, DISPLAY PANEL AND DISPLAY DEVICE COMPRISING THE SAME

CROSS-REFERENCE TO RELATED APPLICATION

This application claims the priority of Korean Patent Application No. 10-2021-0123365, filed on Sep. 15, 2021, which is hereby incorporated by reference in its entirety.

BACKGROUND

Field of the Disclosure

The present disclosure relates to electronic devices, and more specifically, to a display panel and a display device including the display panel.

Description of the Background

As display technology advances, display devices can provide increased functions, such as an image capture function, a sensing function, etc., as well as an image display function. To do this, the display device needs to include an optical electronic device (also referred to as a light detector, a light receiver, or a light sensing device), such as a camera, a sensor for detecting images, and/or the like.

In order to receive light passing through the front surface of the display device, it is desirable for the optical electronic device to be located in an area of the display device where incident light coming from the front surface can be advantageously received or detected. Thus, in such a typical display device, the camera (e.g., a camera lens) or/and the sensor for detecting images are generally located in a front portion of the display device in order to be effectively exposed to incident light. According to such an implementation, in order to install the camera and/or the sensor, an increased bezel of the display device is designed, or a notch or a hole is formed in a display area of a display panel of the display device.

In light of this situation, the display device is needed to have higher transmittance to perform intended functions even when the optical electronic device, such as the camera, the sensor, and/or the like, that receives or detects incident light, and performs a predefined function is provided in the display device.

SUMMARY

Accordingly, the present disclosure is to provide a display panel and a display device having a light transmission structure in which even when the optical electronic device is located under the display area of the display panel, and thus, is not exposed in the front surface of the display device, the optical electronic device can normally receive or detect light.

In addition, the present disclosure is to provide a display panel and a display device having a structure of having high transmittance and excellent heat resistance in an area where the optical electronic device is located, and in turn, not causing a process defect even in a subsequent process.

Various aspects of the present disclosure provide to a display panel and a display device that are capable of reducing a non-display area of the display panel and enabling an optical electronic device such as a camera, a sensor, and/or the like not to be exposed in the front surface of the display panel by disposing the optical electronic device under a display area, or at a lower portion, of the display panel.

Various aspects of the present disclosure provide a display panel and a display device that have a light transmission structure for enabling the optical electronic device under the display area, or at a lower portion, of the display panel to normally receive light transmitting the display panel.

Various aspects of the present disclosure provide a display panel and a display device that are capable of normally performing display driving in an optical area included in the display area of the display panel and overlapping with the optical electronic device.

According to an aspect of the present disclosure, a display panel and a display device include a display area comprising a first optical area comprising a plurality of light emitting areas and a plurality of first transmission areas, and a non-optical area located outside of the first optical area and comprising a plurality of light emitting areas, a non-display area; and a first optical electronic device located under, at a lower portion of, the display panel and overlapping with at least a portion of the first optical area included in the display area, the display panel comprising: a first substrate disposed on at least a portion of the non-optical area; a second substrate disposed on the first substrate; a third substrate disposed in the first optical area and having a transmittance higher than the first substrate and the second substrate; and a bonding layer disposed on at least one surface or portion of the third substrate.

Various aspects of the present disclosure can provide the display panel capable of reducing a non-display area of the display panel and enabling an optical electronic device such as a camera, a sensor, and/or the like not to be exposed in the front surface of the display panel by disposing the optical electronic device under a display area, or at a lower portion, of the display panel, and the display device including the display panel.

Various aspects of the present disclosure can provide the display panel having a light transmission structure for enabling an optical electronic device under the display area, or at a lower portion, of the display panel to normally receive light transmitting the display panel, and the display device including the display panel.

Various aspects of the present disclosure can provide the display panel capable of normally performing display driving in an optical area included in the display area of the display panel and overlapping with an optical electronic device, and the display device including the display panel.

Various aspects of the present disclosure can provide the display panel having a structure of having high transmittance and excellent heat resistance in an area where optical electronic device is located, and in turn, not causing a process defect even in a subsequent process, and the display device including the display panel.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure. In the drawings.

3

Figure 3:
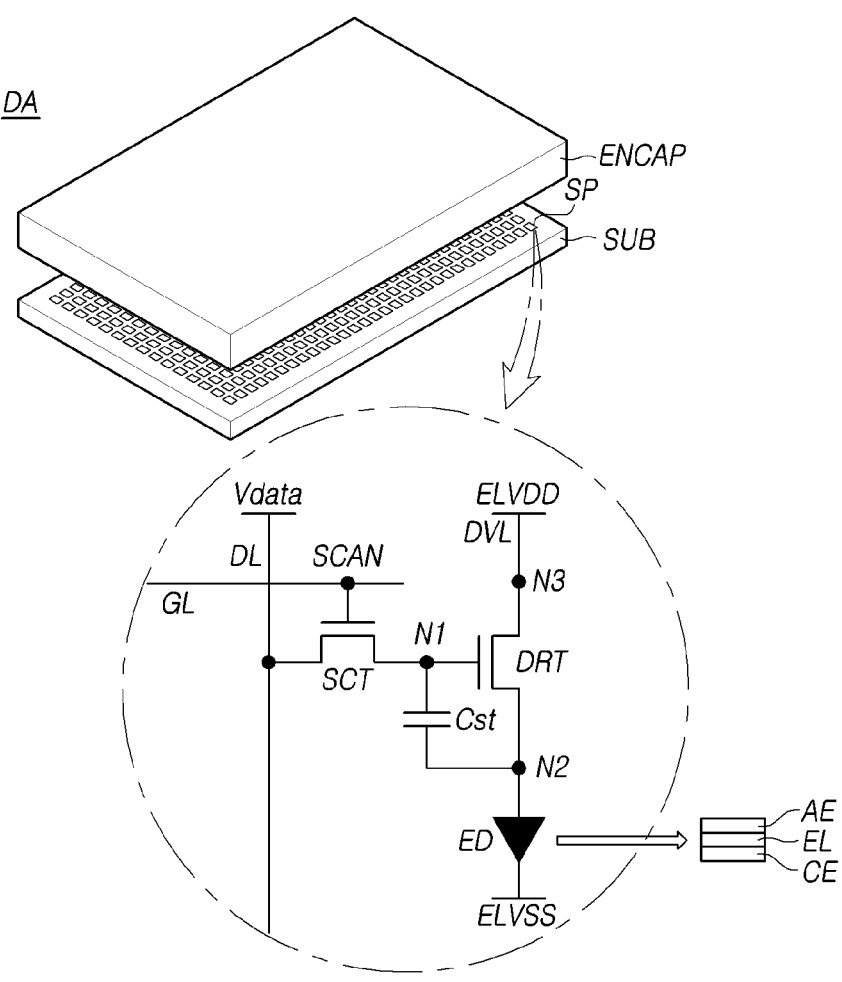
Figure 4:
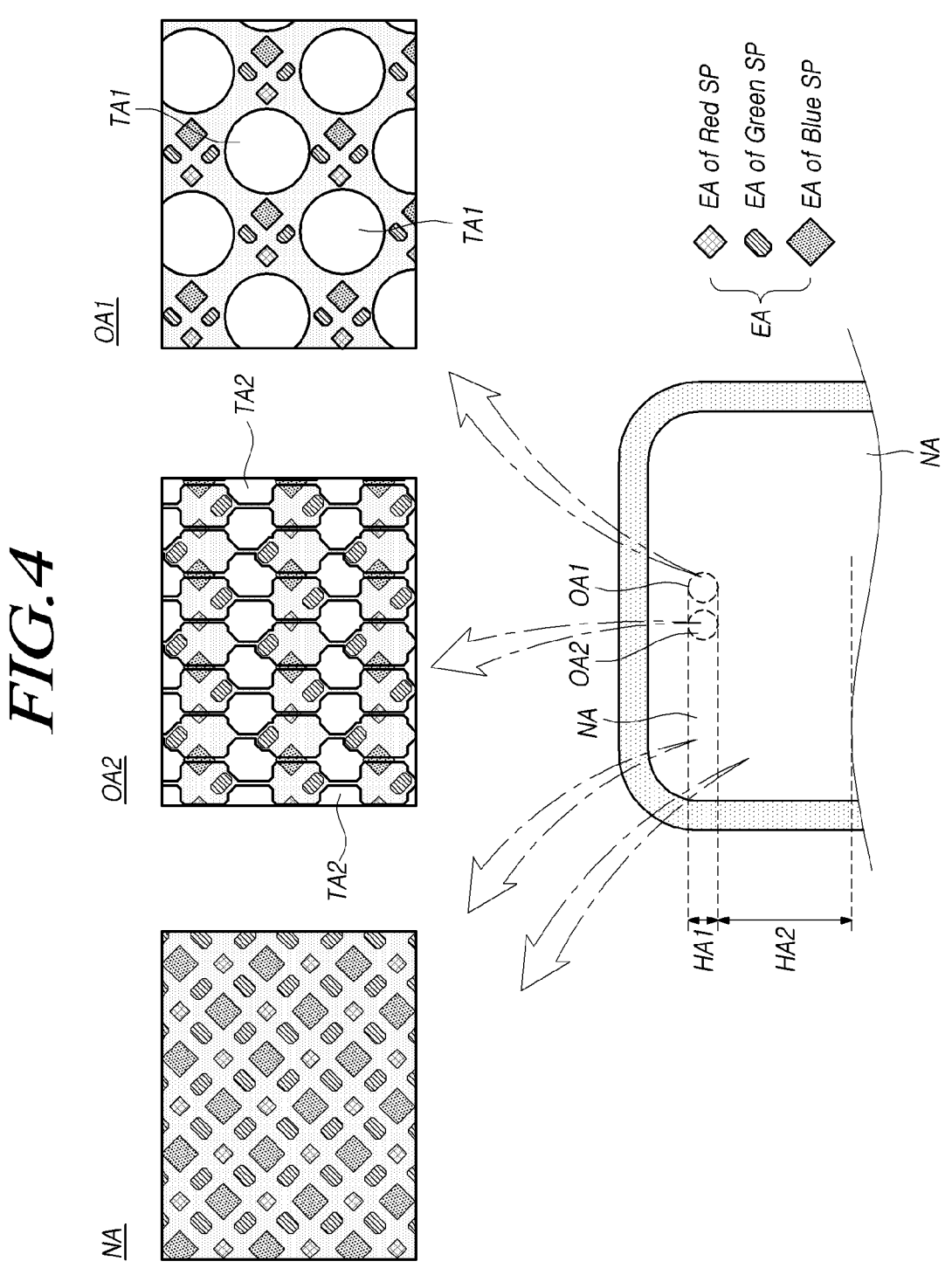
Figure 5A:
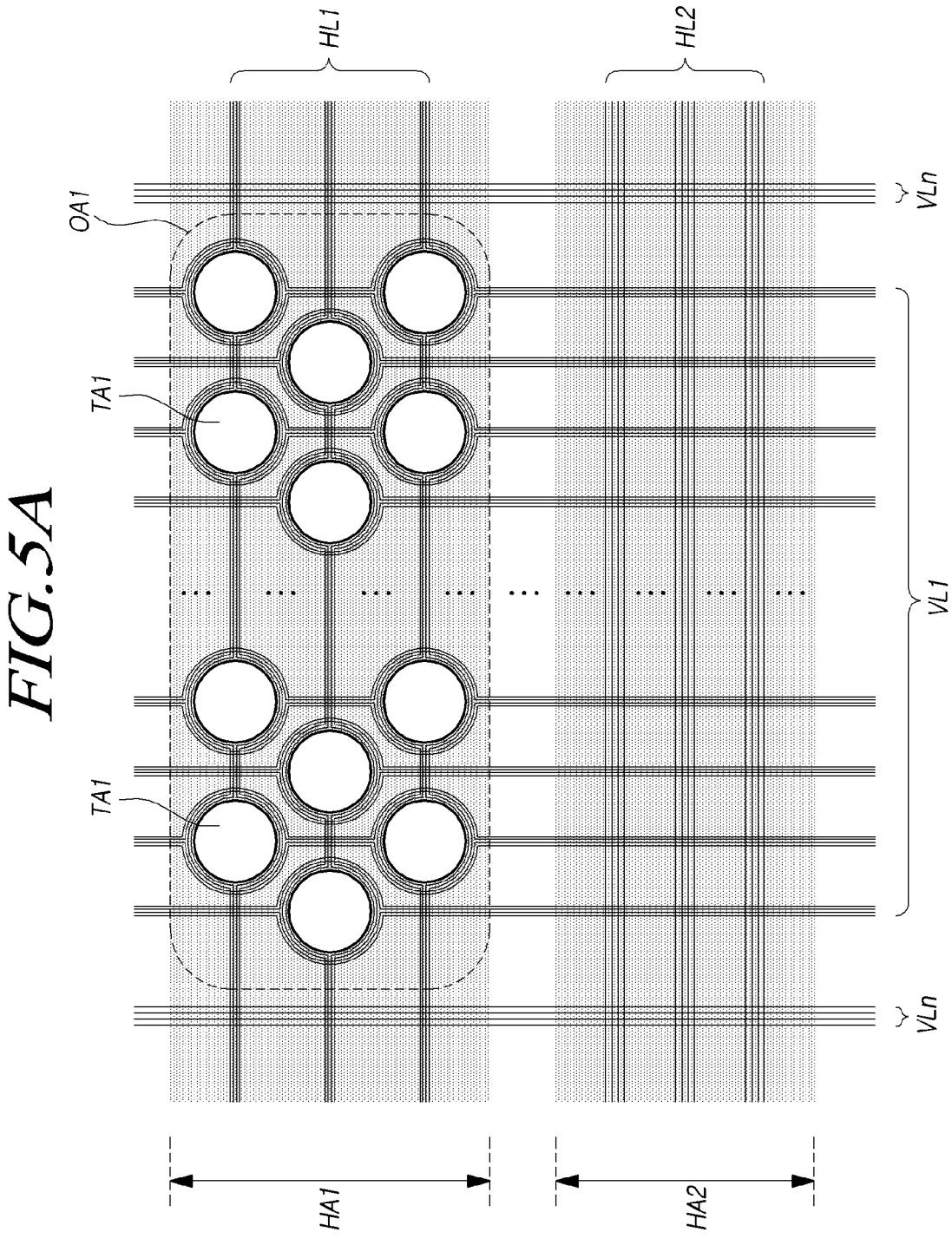
Figure 5B:
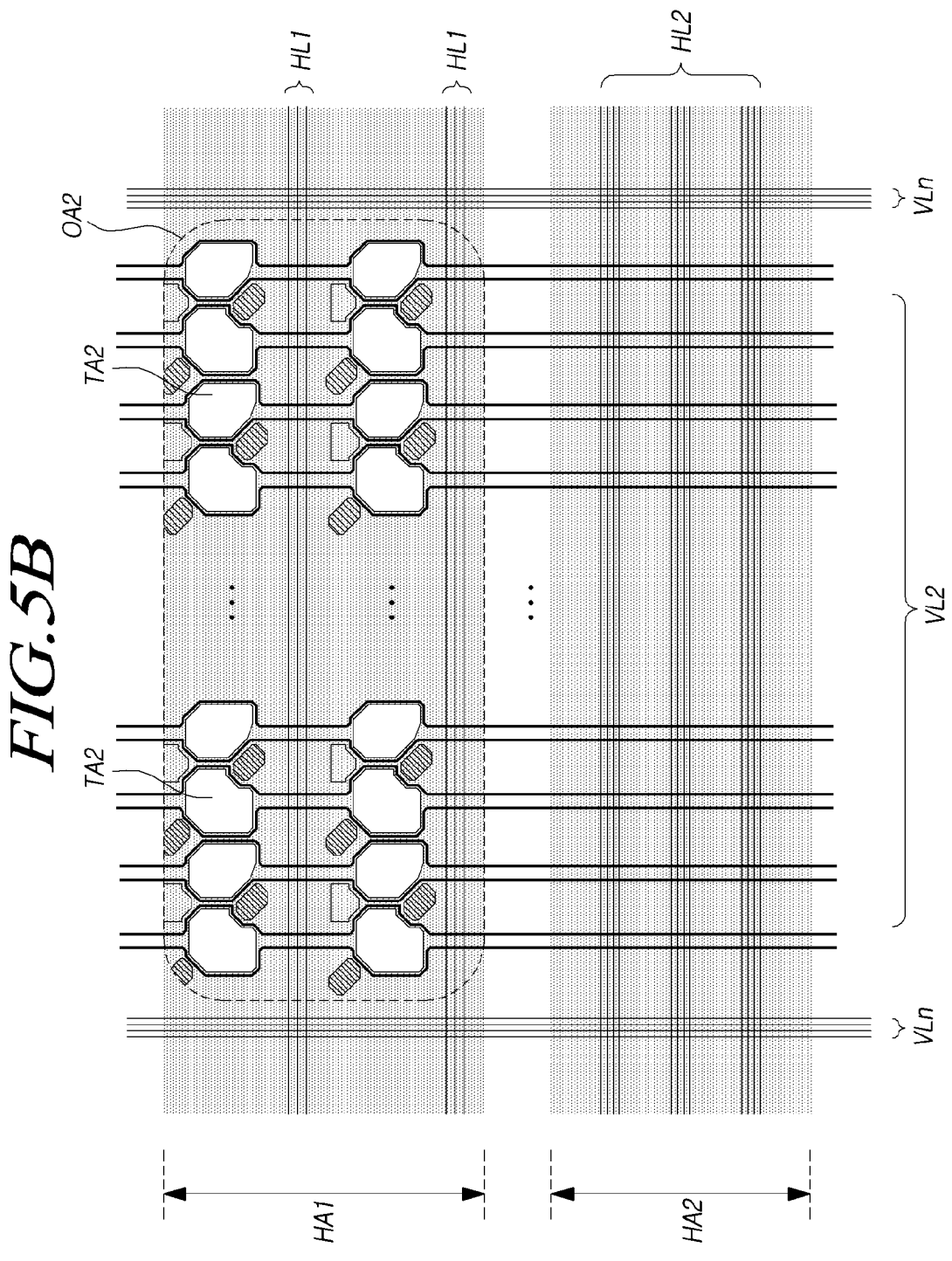
Figure 6:
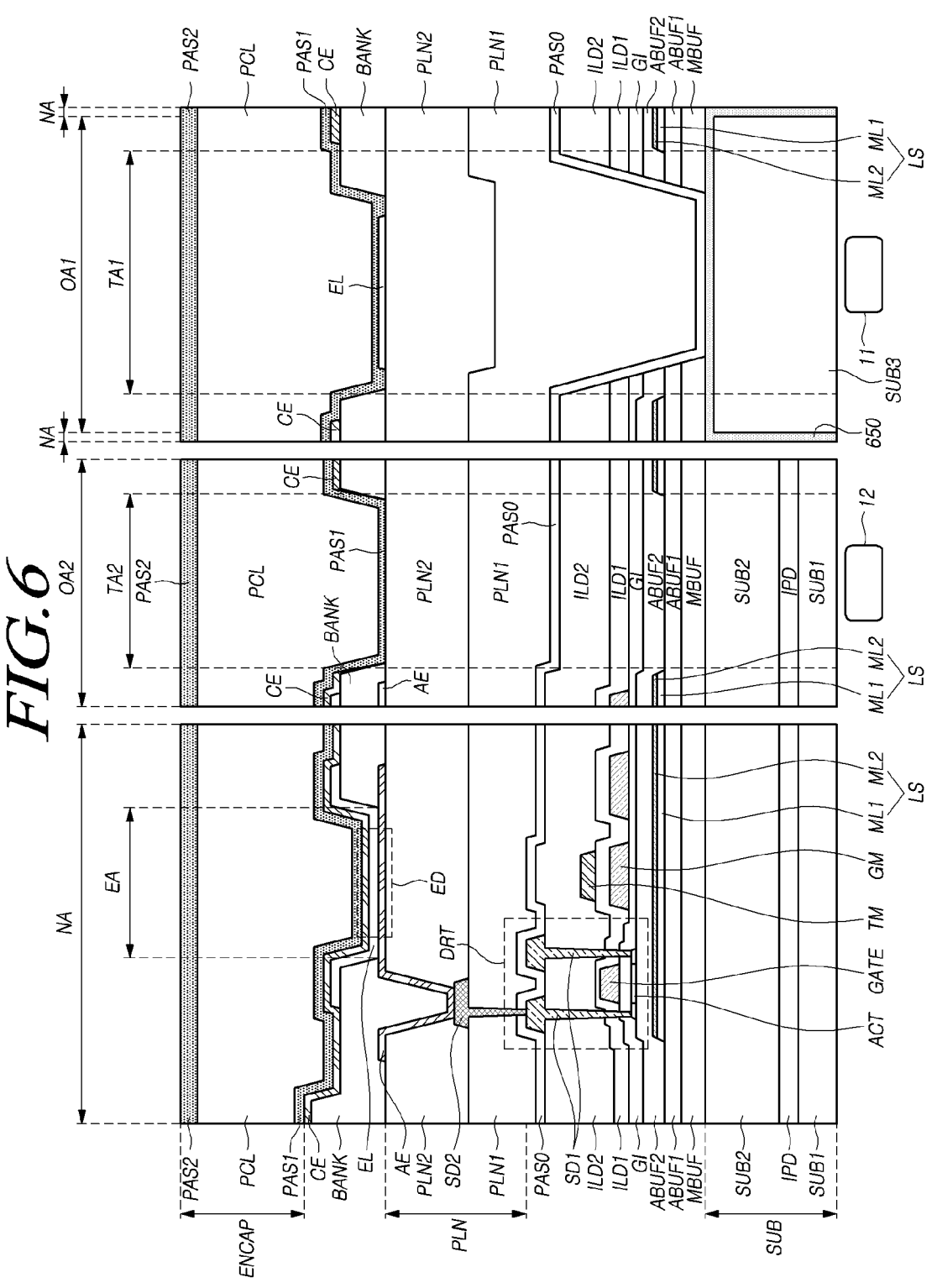
Figure 7:
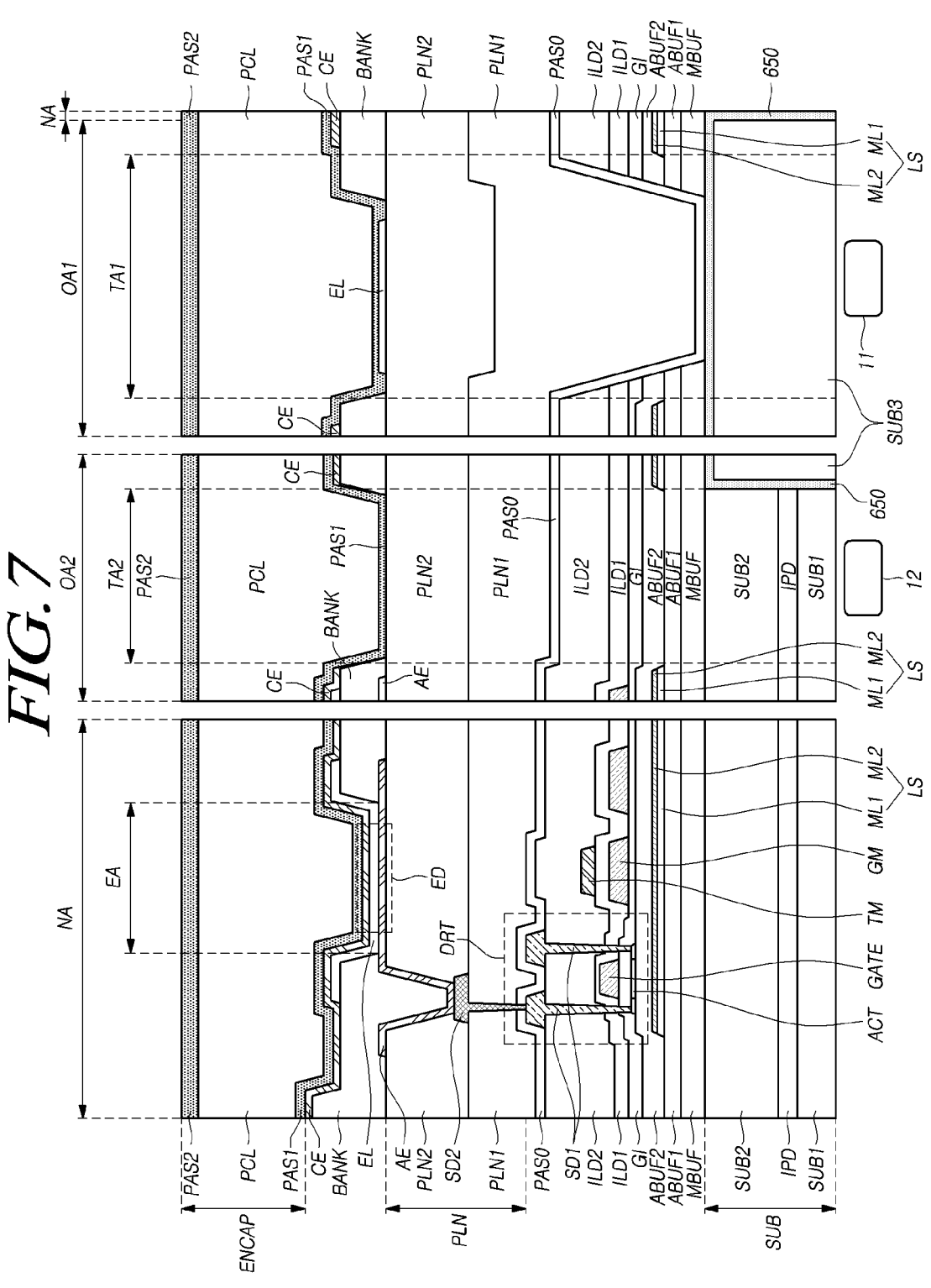
Figure 8:
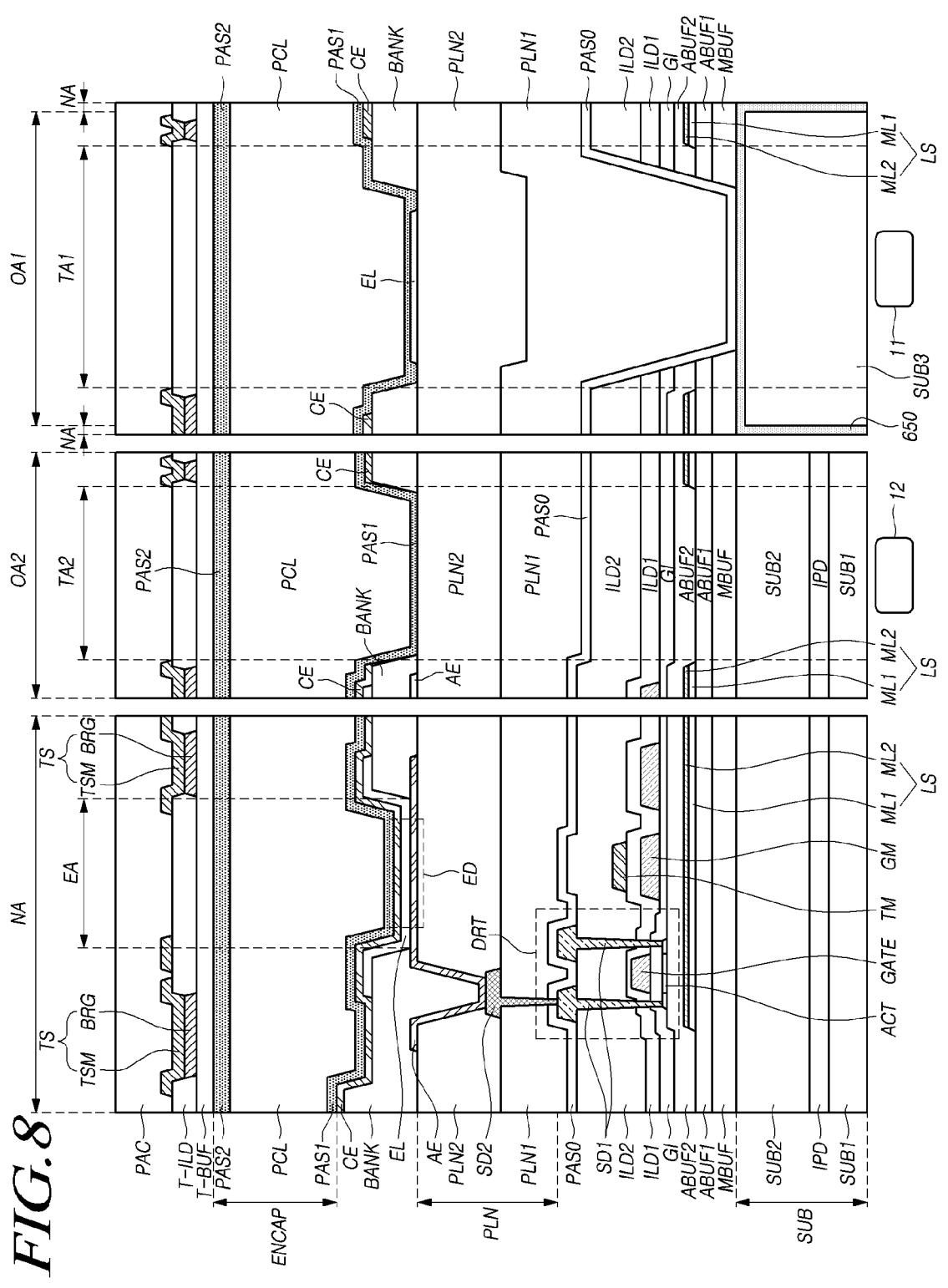
Figure 9:
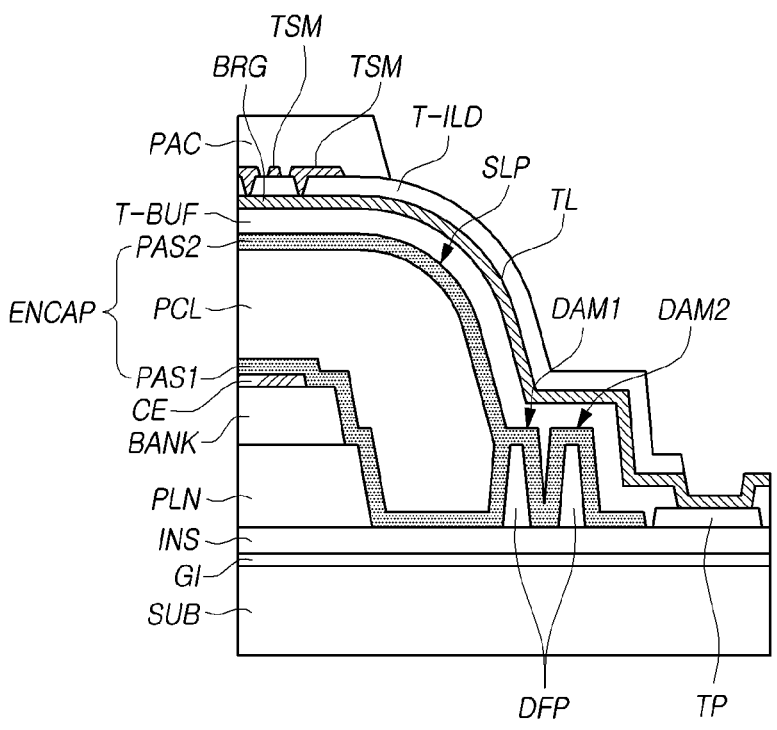

FIG. 3 illustrates an equivalent circuit of a subpixel in a display panel according to aspects of the present disclosure;

FIG. 4 illustrates arrangements of subpixels in three areas included in the display area of the display panel according to aspects of the present disclosure;

FIG. 5A illustrates arrangements of signal lines in each of a first optical area and a non-optical area in the display panel according to aspects of the present disclosure;

FIG. 5B illustrates arrangements of signal lines in each of a second optical area and the non-optical area in the display panel according to aspects of the present disclosure;

FIGS. 6 to 8 are cross-sectional views of the non-optical area, the first optical area, and the second optical area included in the display area of the display panel according to aspects of the present disclosure;

FIG. 9 is a cross-sectional view in an outer edge of the display panel according to aspects of the present disclosure;

FIGS. 10 to 17 illustrate processes of forming a substrate in the display device according to aspects of the present disclosure; and FIG. 18 illustrates transmittance of light with respect to each wavelength in comparative examples 1, 2, and an aspect in the display device according to aspects of the present disclosure.

DETAILED DESCRIPTION

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the description may make the subject matter in some aspects of the present disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlap withs" etc. a second element, it should be interpreted that, not only can the first element "be directly connected or coupled to" or "directly contact or overlap with" the second element, but a third element can also be "interposed" between the first and second elements, or the first and second elements can "be connected or coupled to", "contact or overlap with", etc. each other via a fourth element. Here, the second element may be included in at least one of two or more elements that "are connected or coupled to", "contact or overlap with", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, with reference to the accompanying drawings, various aspects of the present disclosure will be described in detail.

Figure 1A:
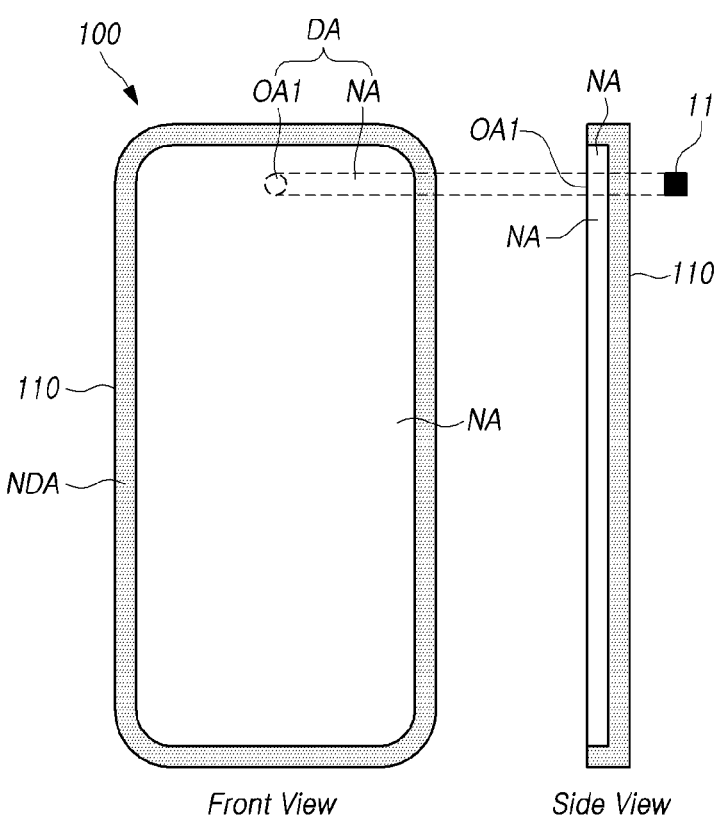
FIGS. 1A, 1B and 1C are plan views illustrating a display device according to aspects of the present disclosure.
Figure 1B:
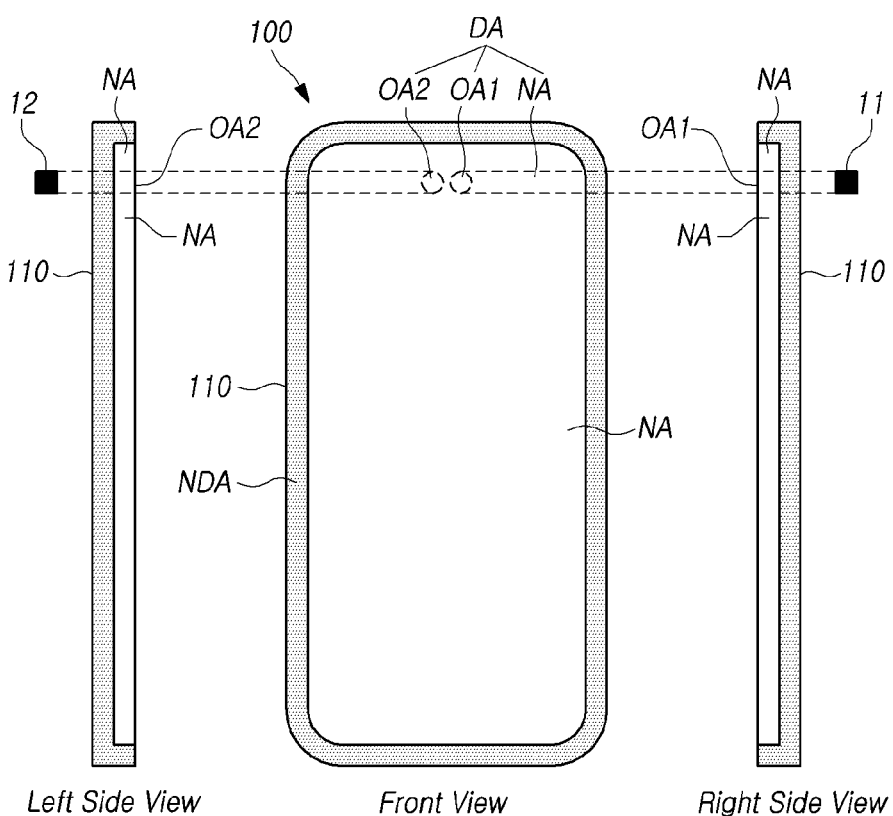
Figure 1C:
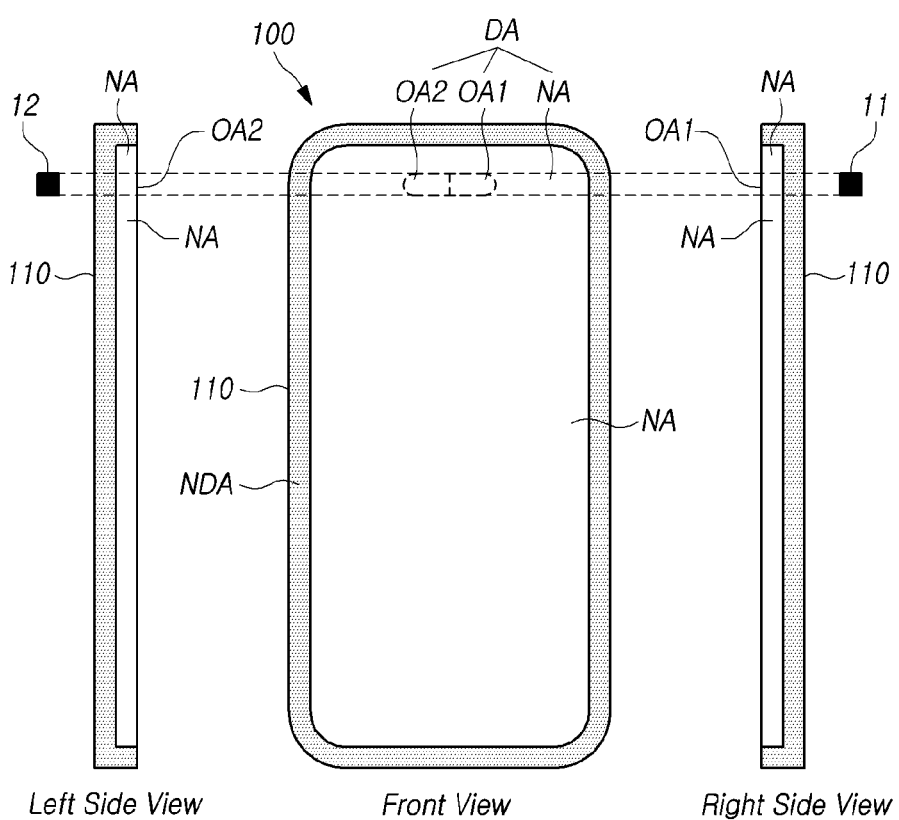

FIGS. 1A, 1B and 1C are plan views illustrating a display device 100 according to aspects of the present disclosure.

Referring to FIGS. 1A, 1B, and 1C, the display device 100 according to aspects of the present disclosure can include a display panel 110 for displaying images, and one or more optical electronic devices (11, 12).

The display panel 110 can include a display area DA in which an image is displayed and a non-display area NDA in which an image is not displayed.

A plurality of subpixels can be arranged in the display area DA, and several types of signal lines for driving the plurality of subpixels can be arranged therein.

The non-display area NDA may refer to an area outside of the display area DA. Several types of signal lines can be arranged in the non-display area NDA, and several types of driving circuits can be connected thereto. At least a portion of the non-display area NDA may be bent to be invisible from the front of the display panel or may be covered by a case (not shown) of the display panel 110 or the display device 100. The non-display area NDA may be also referred to as a bezel or a bezel area.

Referring to FIGS. 1A, 1B, and 1C, in the display device 100 according to aspects of the present disclosure, the one or more optical electronic devices (11, 12) may be located under, or in a lower portion of, the display panel 110 (an opposite side to the viewing surface thereof).

Light can enter the front surface (viewing surface) of the display panel 110, pass through the display panel 110, reach the one or more optical electronic devices (11, 12) located under, or in the lower portion of, the display panel 110 (the opposite side to the viewing surface).

The one or more optical electronic devices (11, 12) can receive or detect light transmitting through the display panel 110 and perform a predefined function based on the received light. For example, the one or more optical electronic devices (11, 12) may include one or more of an image capture device such as a camera (an image sensor), and/or the like, and a sensor such as a proximity sensor, an illuminance sensor, and/or the like.

Referring to FIGS. 1A, 1B, and 1C, in some aspects, the display area DA of the display panel 110 may include one or more optical areas (OA1, OA2) and a non-optical area NA.

Referring to FIGS. 1A, 1B, and 1C, the one or more optical areas (OA1, OA2) may be one or more areas overlapping with the one or more optical electronic devices (11, 12).

According to an example of FIG. 1A, the display area DA may include a first optical area OA1 and a non-optical area NA. In some aspects, at least a portion of the first optical area OA1 may overlap with a first optical electronic device 11.

According to an example of FIG. 1B, the display area DA may include a first optical area OA1, a second optical area OA2, and a non-optical area NA. In the example of FIG. 1B, at least a portion of the non-optical area NA may be present between the first optical area OA1 and the second optical area OA2. In some aspects, at least a portion of the first optical area OA1 may overlap with the first optical electronic device 11, and at least a portion of the second optical area OA2 may overlap with a second optical electronic device 12.

According to an example of FIG. 1C, the display area DA may include a first optical area OA1, a second optical area OA2, and a non-optical area NA. In the example of FIG. 1C, the non-optical area NA may not be present between the first optical area OA1 and the second optical area OA2. For example, the first optical area OA1 and the second optical area OA2 may contact each other. In some aspects, at least a portion of the first optical area OA1 may overlap with the first optical electronic device 11, and at least a portion of the second optical area OA2 may overlap with the second optical electronic device 12.

Both an image display structure and a light transmission structure are needed to be formed in the one or more optical areas (OA1, OA2). In some aspects, since the one or more optical areas (OA1, OA2) are one or more portions of the display area DA, subpixels for displaying images are needed to be disposed in the one or more optical areas (OA1, OA2). Further, for enabling light to transmit the one or more optical areas (OA1, OA2), a light transmission structure is needed to be formed in the one or more optical areas (OA1, OA2).

According to the aspects described above, in spite of a fact that the one or more optical electronic devices (11, 12) are needed to receive or detect light, the one or more optical electronic devices (11, 12) is sometimes located on the back of the display panel 110 (under, or in the lower portion of, the display panel 110, i.e., the opposite side to the viewing surface), and thereby, can receive light that has transmitted the display panel 110.

For example, the one or more optical electronic devices (11, 12) may not be exposed in the front surface (viewing surface) of the display panel 110. Accordingly, when a user looks at the front of the display device 110, the one or more optical electronic devices (11, 12) are located to be invisible to the user.

In one aspect, the first optical electronic device 11 may be a camera, and the second optical electronic device 12 may be a sensor such as a proximity sensor, an illuminance sensor, and/or the like. For example, the sensor may be an infrared sensor capable of detecting infrared rays.

In another aspect, the first optical electronic device 11 may be a sensor, and the second optical electronic device 12 may be a camera.

Hereinafter, for convenience of description, discussions will be conducted on the aspect where the first optical electronic device 11 is a camera, and the second optical electronic device 12 is a sensor such as a proximity sensor, an illuminance sensor, an infrared sensor, and the like. For example, the camera may be a camera lens, an image sensor, or a unit including at least one of the camera lens and the image sensor.

In the example where the first optical electronic device 11 is a camera, this camera may be located on the back of (under, or in the lower portion of) the display panel 110, and be a front camera capable of capturing objects or images in a front direction of the display panel 110. Accordingly, the user can capture an image or object through the camera that is not visible on the viewing surface while looking at the viewing surface of the display panel 110.

Although the non-optical area NA and the one or more optical areas (OA1, OA2) included in the display area DA in each of FIGS. 1A to 1C are areas where images can be displayed, the non-optical area NA is an area where a light transmission structure need not be formed, but the one or more optical areas (OA1, OA2) are areas where the light transmission structure need be formed.

Accordingly, the one or more optical areas (OA1, OA2) may have a transmittance greater than or equal to a predetermined level, i.e., a relatively high transmittance, and the non-optical area NA may not have light transmittance or have a transmittance less than the predetermined level i.e., a relatively low transmittance.

For example, the one or more optical areas (OA1, OA2) may have a resolution, a subpixel arrangement structure, the number of subpixels per unit area, an electrode structure, a line structure, an electrode arrangement structure, a line arrangement structure, or/and the like different from that/those of the non-optical area NA.

In one aspect, the number of subpixels per unit area in the one or more optical areas (OA1, OA2) may be smaller than the number of subpixels per unit area in the non-optical area NA. For example, the resolution of the one or more optical areas (OA1, OA2) may be lower than that of the non-optical area NA. Here, the number of sub-pixels per unit area may be a unit for measuring resolution, for example, referred to as pixels per inch (PPI), which represents the number of pixels within 1 inch.

In one aspect, in each of FIGS. 1A to 1C, the number of subpixels per unit area in the first optical areas OA1 may be smaller than the number of subpixels per unit area in the non-optical area NA. In one aspect, in each of FIGS. 1B and 1C, the number of subpixels per unit area in the second optical areas OA2 may be greater than or equal to the number of subpixels per unit area in the first optical areas OA1.

In each of FIGS. 1A to 1C, the first optical area OA1 may have various shapes, such as a circle, an ellipse, a quadrangle, a hexagon, an octagon or the like. In each of FIGS. 1B to 1C, the second optical area OA2 may have various shapes, such as a circle, an ellipse, a quadrangle, a hexagon, an octagon or the like. The first optical area OA1 and the second optical area OA2 may have the same shape or different shapes.

Referring to FIG. 1C, in the example where the first optical area OA1 and the second optical area OA2 contact each other, the entire optical area including the first optical area OA1 and the second optical area OA2 may also have various shapes, such as a circle, an ellipse, a quadrangle, a hexagon, an octagon or the like.

Hereinafter, for convenience of description, discussions will be conducted based on an aspect in which each of the first optical area OA1 and the second optical area OA2 has a circular shape.

Herein, the display device 100 according to aspects of the present disclosure having a structure in which the first optical electronic device 11 located to be covered under, or in the lower portion of, the display panel 100 without being exposed to the outside is a camera may be referred to as a display (or display device) to which under-display camera (UDC) technology is applied.

The display device 100 according to this configuration can have an advantage of preventing the size of the display area DA from being reduced since a notch or a camera hole for exposing a camera need not be formed in the display panel 110.

Since the notch or the camera hole for camera exposure need not be formed in the display panel 110, the display device 100 can have further advantages of reducing the size of the bezel area, and improving the degree of freedom in design as such limitations to the design are removed.

Although the one or more optical electronic devices (11, 12) are located to be covered under the back of (under, or in the lower portion of) the display panel 110 in the display device 100 according to aspects of the present disclosure, that is, hidden not to be exposed to the outside, the one or more optical electronic devices (11, 12) are needed to be able to receive or detect light for normally performing predefined functionality.

Further, in the display device 100 according to aspects of the present disclosure, although the one or more optical electronic devices (11, 12) are located to be covered under the back of (under, or in the lower portion of) the display panel 110 and located to overlap with the display area DA, it is necessary for image display to be normally performed in the one or more optical areas (OA1, OA2) overlapping with the one or more optical electronic devices (11, 12) in the area DA.

Figure 2:
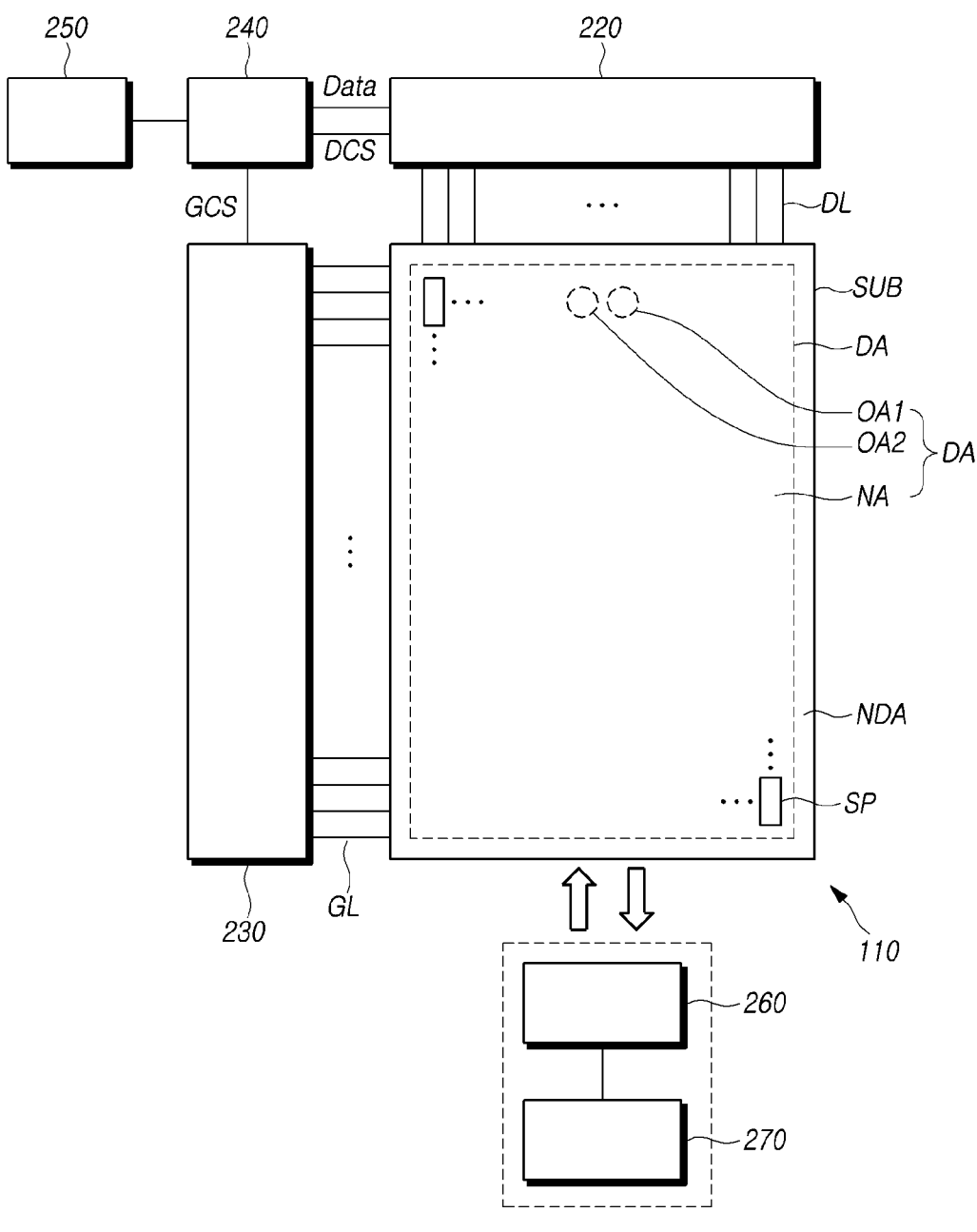
FIG. 2 illustrates a system configuration of the display device according to aspects of the present disclosure.

FIG. 2 illustrates a system configuration of the display device 100 according to aspects of the present disclosure.

Referring to FIG. 2, the display device 100 can include the display panel 110 and a display driving circuit as components for displaying an image.

The display driving circuit is a circuit for driving the display panel 110, and can include a data driving circuit 220, a gate driving circuit 230, a display controller 240, and the like.

The display panel 110 can include a display area DA in which an image is displayed and a non-display area NDA in which an image is not displayed. The non-display area NDA may be an area outside of the display area DA, and may also be referred to as an edge area or a bezel area. All or a portion of the non-display area NDA may be an area visible from the front surface of the display device 100, or an area that is not visible from the front surface of the display device 100 as a corresponding portion is bent.

The display panel 110 can include a substrate SUB and a plurality of subpixels SP disposed on the substrate SUB. The display panel 110 can further include various types of signal lines to drive the plurality of subpixels SP.

The display device 100 according to aspects of the present disclosure may be a liquid crystal display device, or the like, or a self-emission display device in which light is emitted from the display panel 110 itself. In the example where the display device 100 according to aspects of the present disclosure is the self-emission display device, each of the plurality of subpixels SP may include a light emitting element.

In one aspect, the display device 100 according to aspects of the present disclosure may be an organic light emitting display device in which the light emitting element is implemented using an organic light emitting diode (OLED). For another aspect, the display device 100 according to aspects of the present disclosure may be an inorganic light emitting display device in which the light emitting element is implemented using an inorganic material-based light emitting diode. In further another aspect, the display device 100 according to aspects of the present disclosure may be a quantum dot display device in which the light emitting element is implemented using quantum dots, which are self-emission semiconductor crystals.

The structure of each of the plurality of subpixels SP may vary according to types of the display devices 100. In the example where the display device 100 is a self-emission display device including self-emission subpixels SP, each subpixel SP may include a self-emission light emitting element, one or more transistors, and one or more capacitors.

The various types of signal lines arranged in the display device 100 may include, for example, a plurality of data lines DL for carrying data signals (also referred to as data voltages or image signals), a plurality of gate lines GL for carrying gate signals (also referred to as scan signals), and the like.

The plurality of data lines DL and the plurality of gate lines GL may intersect each other. Each of the plurality of data lines DL may be disposed to extend in a first direction. Each of the plurality of gate lines GL may be disposed to extend in a second direction.

For example, the first direction may be a column or vertical direction, and the second direction may be a row or horizontal direction. In another example, the first direction may be the row direction, and the second direction may be the column direction.

The data driving circuit 220 is a circuit for driving the plurality of data lines DL, and can supply data signals to the plurality of data lines DL. The gate driving circuit 230 is a circuit for driving the plurality of gate lines GL, and can supply gate signals to the plurality of gate lines GL.

The display controller 240 is a device for controlling the data driving circuit 220 and the gate driving circuit 230, and can control driving timing for the plurality of data lines DL and driving timing for the plurality of gate lines GL.

The display controller 240 can supply a data driving control signal DCS to the data driving circuit 220 to control the data driving circuit 220, and supply a gate driving control signal GCS to the gate driving circuit 230 to control the gate driving circuit 230.

The display controller 240 can receive input image data from a host system 250 and supply image data Data to the data driving circuit 220 based on the input image data.

The data driving circuit 220 can supply data signals to the plurality of data lines DL according to the driving timing control of the display controller 240.

The data driving circuit 220 can receive the digital image data Data from the display controller 240, convert the received image data Data into analog data signals, and supply the resulting analog data signals to the plurality of data lines DL.

The gate driving circuit 230 can supply gate signals to the plurality of gate lines GL according to the timing control of the display controller 240. The gate driving circuit 230 can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some aspects, the data driving circuit 220 may be connected to the display panel 110 in a tape automated bonding (TAB) type, or connected to a conductive pad such as a bonding pad of the display panel 110 in a chip on glass (COG) type or a chip on panel (COP) type, or connected to the display panel 110 in a chip on film (COF) type.

In some aspects, the gate driving circuit 230 may be connected to the display panel 110 in the tape automated bonding (TAB) type, or connected to a conductive pad such as a bonding pad of the display panel 110 in the chip on glass (COG) type or the chip on panel (COP) type, or connected to the display panel 110 in the chip on film (COF) type. In another aspect, the gate driving circuit 230 may be disposed in the non-display area NDA of the display panel 110 in a gate in panel (GIP) type. The gate driving circuit 230 may be disposed on or over the substrate, or connected to the substrate. That is, in the case of the GIP type, the gate driving circuit 230 may be disposed in the non-display area NDA of the substrate. The gate driving circuit 230 may be connected to the substrate in the case of the chip on glass (COG) type, the chip on film (COF) type, or the like.

At least one of the data driving circuit 220 and the gate driving circuit 230 may be disposed in the display area DA of the display panel 110. For example, at least one of the data driving circuit 220 and the gate driving circuit 230 may be disposed not to overlap with subpixels SP, or disposed to overlap with one or more, or all, of the subpixels SP.

The data driving circuit 220 may also be located on, but not limited to, only one side or portion (e.g., an upper edge or a lower edge) of the display panel 110. In some aspects, the data driving circuit 220 may be located in, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 230 may be located in only one side or portion (e.g., a left edge or a right edge) of the display panel 110. In some aspects, the gate driving circuit 230 may be connected to or located in two sides or portions (e.g., a left edge and a right edge) of the display panel 110, or be connected to or located in at least two of four sides or portions (e.g., an upper edge, a lower edge, the left edge, and the right edge) of the display panel 110 according to driving schemes, panel design schemes, or the like.

The display controller 240 may be implemented in a separate component from the data driving circuit 220, or integrated with the data driving circuit 220 and thus implemented in an integrated circuit.

The display controller 240 may be a timing controller used in the typical display technology or a controller or a control device capable of additionally performing other control functions in addition to the function of the typical timing controller. In some aspects, the display controller 140 may be a controller or a control device different from the timing controller, or a circuitry or a component included in the controller or the control device. The display controller 240 may be implemented with various circuits or electronic components such as an integrated circuit (IC), a field programmable gate array (FPGA), an application specific integrated circuit (ASIC), a processor, and/or the like.

The display controller 240 may be mounted on a printed circuit board, a flexible printed circuit, and/or the like and be electrically connected to the gate driving circuit 220 and the data driving circuit 230 through the printed circuit board, flexible printed circuit, and/or the like.

The display controller 240 may transmit signals to, and receive signals from, the data driving circuit 220 via one or more predefined interfaces. In some aspects, such interfaces may include a low voltage differential signaling (LVDS) interface, an EPI interface, a serial peripheral interface (SP), and the like.

In some aspects, in order to further provide a touch sensing function, as well as an image display function, the display device 100 may include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit 260 capable of generating and providing touch sensing data by driving and sensing the touch sensor, a touch controller 270 capable of detecting the occurrence of a touch event or detecting a touch position using the touch sensing data, and the like.

The touch sensor can include a plurality of touch electrodes. The touch sensor can further include a plurality of touch lines for electrically connecting the plurality of touch electrodes to the touch driving circuit 260.

The touch sensor may be implemented in a touch panel, or in the form of a touch panel, outside of the display panel 110, or be implemented inside of the display panel 110. When the touch sensor is implemented in the touch panel, or in the form of the touch panel, outside of the display panel 110, such a touch sensor is referred to as an add-on type. When the add-on type of touch sensor is disposed, the touch panel and the display panel 110 may be separately manufactured and coupled during an assembly process. The add-on type of touch panel may include a touch panel substrate and a plurality of touch electrodes on the touch panel substrate.

When the touch sensor is implemented inside of the display panel 110, the touch sensor may be disposed over the substrate SUB together with signal lines and electrodes related to display driving during the process of manufacturing the display panel 110.

The touch driving circuit 260 can supply a touch driving signal to at least one of the plurality of touch electrodes, and sense at least one of the plurality of touch electrodes to generate touch sensing data.

The touch sensing circuit can perform touch sensing using a self-capacitance sensing method or a mutual-capacitance sensing method.

When the touch sensing circuit performs touch sensing in the self-capacitance sensing method, the touch sensing circuit can perform touch sensing based on capacitance between each touch electrode and a touch object (e.g., a finger, a pen, etc.).

According to the self-capacitance sensing method, each of the plurality of touch electrodes can serve as both a driving touch electrode and a sensing touch electrode. The touch driving circuit 260 can drive all, or one or more, of the plurality of touch electrodes and sense al, or one or more, of the plurality of touch electrodes.

When the touch sensing circuit performs touch sensing in the mutual-capacitance sensing method, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit 260 can drive the driving touch electrodes and sense the sensing touch electrodes.

The touch driving circuit 260 and the touch controller 270 included in the touch sensing circuit may be implemented in separate devices or in a single device. Further, the touch driving circuit 260 and the data driving circuit 220 may be implemented in separate devices or in a single device.

The display device 100 may further include a power supply circuit for supplying various types of power to the display driving circuit and/or the touch sensing circuit.

The display device 100 according to aspects of the present disclosure may be a mobile terminal such as a smart phone, a tablet, or the like, or a monitor, a television (TV), or the like. Such devices may be of various types, sizes, and shapes. The display device 100 according to aspects of the present disclosure are not limited thereto, and includes displays of various types, sizes, and shapes for displaying information or images.

As described above, the display area DA of the display panel 110 may include a non-optical area NA and one or more optical areas (OA1, OA2), for example, as shown in FIGS. 1A to 1C.

The non-optical area NA and the one or more optical areas (OA1, OA2) are areas where an image can be displayed. However, the non-optical NA is an area in which a light transmission structure need not be implemented, and the one or more optical areas OA1, OA2 are areas in which the light transmission structure need be implemented.

As discussed above with respect to the examples of FIGS. 1A to 1C, although the display area DA of the display panel 110 may include the one or more optical areas (OA1, OA2) in addition to the non-optical area NA, for convenience of description, in the discussion that follows, it is assumed that the display area DA includes first and second optical areas (OA1, OA2) and the non-optical area NA; and the non-optical area NA thereof includes the non-optical areas NAs in FIGS. 1A to 1C, and the first and second optical areas (OA1, OA2) thereof include the first optical areas OA1*s* in FIGS. 1A to 1C and the second optical areas OA2*s* of FIGS. 1B and 1C, respectively, unless explicitly stated otherwise.

FIG. 3 illustrates an equivalent circuit of a subpixel SP in the display panel 110 according to aspects of the present disclosure.

Each of subpixels SP disposed in the non-optical area NA, the first optical area OA1, and the second optical area OA2 included in the display area DA of the display panel 110 may include a light emitting element ED, a driving transistor DRT for driving the light emitting element ED, a scan transistor SCT for transmitting a data voltage VDATA to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 may be a gate node, the second node N2 may be a source node or a drain node, and the third node N3 may be the drain node or the source node.

The light emitting element ED can include an anode electrode AE, an emission layer EL, and a cathode electrode CE. The anode electrode AE may be a pixel electrode disposed in each subpixel SP, and may be electrically connected to the second node N2 of the driving transistor DRT of each subpixel SP. The cathode electrode CE may be a common electrode commonly disposed in the plurality of subpixels SP, and a base voltage ELVSS such as a low-level voltage may be applied to the cathode electrode CE.

For example, the anode electrode AE may be the pixel electrode, and the cathode electrode CE may be the common electrode. In another example, the anode electrode AE may be the common electrode, and the cathode electrode CE may be the pixel electrode. For convenience of description, in the discussion that follows, it is assumed that the anode electrode AE is the pixel electrode, and the cathode electrode CE is the common electrode unless explicitly stated otherwise.

The light emitting element ED may be, for example, an organic light emitting diode (OLED), an inorganic light emitting diode, a quantum dot light emitting element, or the like. In the example where an organic light emitting diode is used as the light emitting element ED, the emission layer EL included in the light emitting element ED may include an organic emission layer including an organic material.

The scan transistor SCT may be turned on and off by a scan signal SCAN that is a gate signal applied through a gate line GL, and be electrically connected between the first node N1 of the driving transistor DRT and a data line DL.

The storage capacitor Cst may be electrically connected between the first node N1 and the second node N2 of the driving transistor DRT.

Each subpixel SP may include two transistors (2T: DRT and SCT) and one capacitor (1C: Cst) (referred to as "2T1C structure") as shown in FIG. 3, and in some cases, may further include one or more transistors, or further include one or more capacitors.

The storage capacitor Cst may be an external capacitor intentionally designed to be located outside of the driving transistor DRT, other than an internal capacitor, such as a parasitic capacitor (e.g., a Cgs, a Cgd), that may be present between the first node N1 and the second node N2 of the driving transistor DRT.

Each of the driving transistor DRT and the scan transistor SCT may be an n-type transistor or a p-type transistor.

Since circuit elements (in particular, a light emitting element ED) in each subpixel SP are vulnerable to external moisture or oxygen, an encapsulation layer ENCAP may be disposed in the display panel 110 in order to prevent the external moisture or oxygen from penetrating into the circuit elements (in particular, the light emitting element ED). The encapsulation layer ENCAP may be disposed to cover the light emitting element ED.

FIG. 4 illustrates arrangements of subpixels SP in the three areas (NA, OA1, and OA2) included in the display area DA of the display panel 110 according to aspects of the present disclosure.

Referring to FIG. 4, a plurality of subpixels SP may be disposed in each of the non-optical area NA, the first optical area OA1, and the second optical area OA2 included in the display area DA.

The plurality of subpixels SP may include, for example, a red subpixel (Red SP) emitting red light, a green subpixel (Green SP) emitting green light, and a blue subpixel (Blue SP) emitting blue light.

Accordingly, each of the non-optical area NA, the first optical area OA1, and the second optical area OA2 may include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, the non-optical area NA may not include a light transmission structure, but may include light emitting areas EA.

However, the first optical area OA1 and the second optical area OA2 need to include both the light emitting areas EA and the light transmission structure.

Accordingly, the first optical area OA1 can include light emitting areas EA and first transmission areas TA1, and the second optical area OA2 can include the light emitting areas EA and second transmission area TA2.

The light emitting areas EA and the transmission areas (TA1, TA2) may be distinct according to whether the transmission of light is allowed. That is, the light emitting areas EA may be areas not allowing light to transmit, and the transmission areas TA1, TA2 may be area allowing light to transmit.

The light emitting areas EA and the transmission areas TA1, TA2 may be also distinct according to whether or not a specific metal layer CE is included. For example, the cathode electrode CE may be disposed in the light emitting areas EA, and the cathode electrode CE may not be disposed in the transmission areas (TA1, TA2). Further, a light shield layer may be disposed in the light emitting areas EA, and a light shield layer may not be disposed in the transmission areas (TA1, TA2).

Since the first optical area OA1 includes the first transmission areas TA1 and the second optical area OA2 includes the second transmission areas TA2, both of the first optical area OA1 and the second optical area OA2 are areas through which light can pass.

In one aspect, a transmittance (a degree of transmission) of the first optical area OA1 and a transmittance (a degree of transmission) of the second optical area OA2 may be substantially equal.

For example, the first transmission area TA1 of the first optical area OA1 and the second transmission area TA2 of the second optical area OA2 may have a substantially equal shape or size. In another example, even when the first transmission area TA1 of the first optical area OA1 and the second transmission area TA2 of the second optical area OA2 have different shapes or sizes, a ratio of an area of the first transmission area TA1 to the first optical area OA1 and a ratio of an area of the second transmission area TA2 to the second optical area OA2 may be substantially equal.

In another aspect, a transmittance (a degree of transmission) of the first optical area OA1 and a transmittance (a degree of transmission) of the second optical area OA2 may be different.

For example, the first transmission area TA1 of the first optical area OA1 and the second transmission area TA2 of the second optical area OA2 may have different shapes or sizes. In another example, even when the first transmission area TA1 of the first optical area OA1 and the second transmission area TA2 of the second optical area OA2 have a substantially equal shape or size, a ratio of the first transmission area TA1 to the first optical area OA1 and a ratio of the second transmission area TA2 to the second optical area OA2 may be different from each other.

For example, in a case where the first optical electronic device 11 overlapping with the first optical area OA1 is a camera, and the second optical electronic device 12 overlapping with the second optical area OA2 is a sensor for detecting images, the camera may need a greater amount of light than the sensor.

Thus, the transmittance (degree of transmission) of the first optical area OA1 may be greater than the transmittance (degree of transmission) of the second optical area OA2.

For example, the first transmission area TA1 of the first optical area OA1 may have a size greater than the second transmission area TA2 of the second optical area OA2. In another example, even when the first transmission area TA1 of the first optical area OA1 and the second transmission area TA2 of the second optical area OA2 have a substantially equal size, a ratio of the first transmission area TA1 to the first optical area OA1 may be greater than a ratio of the second transmission area TA2 to the second optical area OA2.

For convenience of description, the discussion that follows is performed based on the aspect in which the transmittance (degree of transmission) of the first optical area OA1 is greater than the transmittance (degree of transmission) of the second optical area OA2.

Further, the transmission areas (TA1, TA2) as shown in FIG. 4 may be referred to as transparent areas, and the term transmittance may be referred to as transparency.

Further, in the discussion that follows, it is assumed that the first optical areas OA1 and the second optical areas OA2 are located in an upper edge of the display area DA of the display panel 110, and are disposed to be horizontally adjacent to each other such as being disposed in a direction in which the upper edge extends, as shown in FIG. 4, unless explicitly stated otherwise. But the aspects of the present disclosure are not limited thereto. For example, the first optical areas OA1 and the second optical areas OA2 may be located in any position of the display area DA of the display panel 110. For example, the first optical areas OA1 and the second optical areas OA2 may be located in any of the upper edge, the lower edge, the left edge, the right edge and the central region of the display area DA of the display panel 110. For example, the first optical areas OA1 and the second optical areas OA2 may be arranged along any direction in the display panel 110.

Referring to FIG. 4, a horizontal display area in which the first optical area OA1 and the second optical area OA2 are disposed is referred to as a first horizontal display area HA1 and another horizontal display area in which the first optical area OA1 and the second optical area OA2 are not disposed is referred to as a second horizontal display area HA2.

Referring to FIG. 4, the first horizontal display area HA1 may include a portion of the non-optical area NA, the first optical area OA1, and the second optical area OA2. The second horizontal display area HA2 may include only another portion of the non-optical area NA.

FIG. 5A illustrates arrangements of signal lines in each of the first optical area OA1 and the non-optical area NA of the display panel 110 according to aspects of the present disclosure, and FIG. 5B illustrates arrangements of signal lines in each of the second optical area OA2 and the non-optical area NA of the display panel 110 according to aspects of the present disclosure.

First horizontal display areas HA1 shown in FIGS. 5A and 5B are portions of the first horizontal display area HA1 of the display panel 110, and second horizontal display areas HA2 therein are portions of the second horizontal display area HA2 of the display panel 110.

A first optical area OA1 shown in FIG. 5A is a portion of the first optical area OA1 of the display panel 110, and a second optical area OA2 shown in FIG. 5B is a portion of the second optical area OA2 of the display panel 110.

Referring to FIGS. 5A and 5B, the first horizontal display area HA1 may include a portion of the non-optical area NA, the first optical area OA1, and the second optical area OA2. The second horizontal display area HA2 may include another portion of the non-optical area NA.

Various types of horizontal lines HL1, HL2 and various types of vertical lines VLn, VL1, VL2 may be disposed in the display panel 11.

Herein, the term "horizontal" and the term "vertical" are used to refer to two directions intersecting the display panel; however, it should be noted that the horizontal direction and the vertical direction may be changed depending on a viewing direction. The horizontal direction may refer to, for example, a direction in which one gate line GL is disposed to extend and, and the vertical direction may refer to, for example, a direction in which one data line DL is disposed to extend. As such, the term horizontal and the term vertical are used to represent two directions.

Referring to FIGS. 5A and 5B, the horizontal lines disposed in the display panel 110 may include first horizontal lines HL1 disposed in the first horizontal display area HA1 and second horizontal lines HL2 disposed on the second horizontal display area HA2.

The horizontal lines disposed in the display panel 110 may be gate lines GL. That is, the first horizontal lines HL1 and the second horizontal lines HL2 may be the gate lines GL. The gate lines GL may include various types of gate lines according to structures of one or more subpixels SP.

Referring to FIGS. 5A and 5B, the vertical lines disposed in the display panel 110 may include typical vertical lines VLn disposed only in the non-optical area NA, first vertical lines VL1 running through both of the first optical area OA1 and the non-optical area NA, second vertical lines VL2 running through both of the second optical area OA2 and the non-optical area NA.

The vertical lines disposed in the display panel 110 may include data lines DL, driving voltage lines DVL, and the like, and may further include reference voltage lines, initialization voltage lines, and the like. That is, the typical vertical lines VLn, the first vertical lines VL1 and the second vertical lines VL2 may include the data lines DL, the driving voltage lines DVL, and the like, and may further include the reference voltage lines, the initialization voltage lines, and the like.

In some aspects, it should be noted that the term "horizontal" in the second horizontal line HL2 may mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, however, one or more of the second horizontal lines HL2 may include one or more bent or folded portions differently from the configurations thereof. Likewise, one or more of the first horizontal lines HL1 may also include one or more bent or folded portions.

In some aspects, it should be noted that the term "vertical" in the typical vertical line VLn may mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, however, one or more of the typical vertical lines VLn may include one or more bent or folded portions differently from the configurations thereof. Likewise, one or more of the first vertical line VL1 and one or more of the second vertical line VL2 may also include one or more bent or folded portions.

Referring to FIG. 5A, the first optical area OA1 included in the first horizontal area HA1 may include light emitting areas EA and first transmission areas TA1. In the first optical area OA1, respective outer areas of the first transmission areas TA1 may include corresponding light emitting areas EA.

Referring to FIG. 5A, in order to improve the transmittance of the first optical area OA1, the first horizontal lines HL1 may run through the first optical area OA1 by avoiding the first transmission areas TA1 in the first optical area OA1.

Accordingly, each of the first horizontal lines HL1 running through the first optical area OA1 may include one or more curved or bent portions running around one or more respective outer edges of one or more of the first transmission areas TA1.

Accordingly, the first horizontal lines HL1 disposed in the first horizontal area HA1 and the second horizontal lines HL2 disposed in the second horizontal area HA2 may have different shapes or lengths. For example, the first horizontal lines HL1 running through the first optical area OA1 and the second horizontal lines HL2 not running through the first optical area OA1 may have different shapes or lengths.

Further, in order to improve the transmittance of the first optical area OA1, the first vertical lines VL1 may run through the first optical area OA1 by avoiding the first transmission areas TA1 in the first optical area OA1.

Accordingly, each of the first vertical lines VL1 running through the first optical area OA1 may include one or more curved or bent portions running around one or more respective outer edges of one or more of the first transmission areas TA1.

Thus, the first vertical lines VL1 running through the first optical area OA1 and the typical vertical lines VLn disposed in the non-optical area NA without running through the first optical area OA1 may have different shapes or lengths.

Referring to FIG. 5A, the first transmission areas TA1 included in the first optical area OA1 in the first horizontal area HA1 may be arranged in a diagonal direction.

Referring to FIG. 5A, in the first optical area OA1 in the first horizontal area HAL one or more light emitting areas EA may be disposed between two horizontally adjacent first transmission areas TA1. In the first optical area OA1 in the first horizontal area HAL one or more light emitting areas EA may be disposed between two vertically adjacent first transmission areas TA1.

Referring to FIG. 5A, the first horizontal lines HL1 disposed in the first horizontal area HAL that is, the first horizontal lines HL1 running through the first optical area OA1 each may include one or more curved or bent portions running around one or more respective outer edges of one or more of the first transmission areas TA1.

Referring to FIG. 5B, the second optical area OA2 included in the first horizontal area HA1 may include light emitting areas EA and second transmission areas TA2. In the second optical area OA2, respective outer areas of the second transmission areas TA2 may include corresponding light emitting areas EA.

In one aspect, the light emitting areas EA and the second transmission areas TA2 in the second optical area OA2 may have locations and arrangements substantially equal to the light emitting areas EA and the first transmission areas TA1 in the first optical area OA1 of FIG. 5A.

In another aspect, as shown in FIG. 5B, the light emitting areas EA and the second transmission areas TA2 in the second optical area OA2 may have locations and arrangements different from the light emitting areas EA and the first transmission areas TA1 in the first optical area OA1 of FIG. 5A.

For example, referring to FIG. 5B, the second transmission areas TA2 in the second optical area OA2 may be arranged in the horizontal direction (the left to right or right to left direction). A light emitting area EA may not be disposed between two second transmission areas TA2 adjacent to each other in the horizontal direction. Further, one or more of the light emitting areas EA in the second optical area OA2 may be disposed between second transmission areas TA2 adjacent to each other in the vertical direction (the top to bottom or bottom to top direction). For example, one or more light emitting areas EA may be disposed between two rows of second transmission areas.

When in the first horizontal area HAL running through the second optical area OA2 and the non-optical area NA adjacent to the second optical area OA2, in one aspect, the first horizontal lines HL1 may have substantially the same arrangement as the first horizontal lines HL1 of FIG. 5A.

In another aspect, as shown in FIG. 5B, when in the first horizontal area HAL running through the second optical area OA2 and the non-optical area NA adjacent to the second optical area OA2, the first horizontal lines HL1 may have an arrangement different from the first horizontal lines HL1 of FIG. 5A.

This is because that the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HAL the first horizontal lines HL1 run through the second optical area OA2 and the non-optical area NA adjacent to the second optical area OA2, the first horizontal lines HL1 may run between vertically adjacent second transmission areas TA2 in a straight line without having a curved or bent portion.

For example, one first horizontal line HL1 may have one or more curved or bent portions in the first optical area OA1, but may not have a curved or bent portion in the second optical area OA2.

In order to improve the transmittance of the second optical area OA2, the second vertical lines VL2 may run through the second optical area OA2 by avoiding the second transmission areas TA2 in the second optical area OA2.

Accordingly, each of the second vertical lines VL2 running through the second optical area OA2 may include one or more curved or bent portions running around one or more respective outer edges of one or more of the second transmission areas TA2.

Thus, the second vertical lines VL2 running through the second optical area OA2 and the typical vertical lines VLn disposed in the non-optical area NA without running through the second optical area OA2 may have different shapes or lengths.

As shown in FIG. 5A, each, or one or more, of the first horizontal lines HL1 running through the first optical area OA1 may have one or more curved or bent portions running around one or more respective outer edges of one or more of the first transmission areas TA1.

Accordingly, a length of the first horizontal line HL1 running through the first optical area OA1 and the second optical area OA2 may be slightly longer than a length of the second horizontal line HL2 disposed only in the non-optical area NA without running through the first optical area OA1 and the second optical area OA2.

Accordingly, a resistance of the first horizontal line HL1 running through the first optical area OA1 and the second optical area OA2, which is referred to as a first resistance, may be slightly greater than a resistance of the second horizontal line HL2 disposed only in the non-optical area NA without running through the first optical area OA1 and the second optical area OA2 and, which is referred to as a second resistance.

Referring to FIGS. 5A and 5B, according to a light transmitting structure, since the first optical area OA1 that at least partially overlap withs the first optical electronic device 11 includes the first transmitting areas TA1, and the second optical area OA2 that at least partially overlap withs with the second optical electronic device 12 includes the second transmission areas TA2, therefore, the first optical area OA1 and the second optical area OA2 may have the number of subpixels per unit area smaller than the non-optical area NA.

Accordingly, the number of subpixels connected to each, or one or more, of the first horizontal lines HL1 running through the first optical area OA1 and the second optical area OA2 may be different from the number of subpixels connected to each, or one or more, of the second horizontal lines HL2 disposed only in the non-optical area NA without running through the first optical area OA1 and the second optical area OA2.

The number of subpixels connected to each, or one or more, of the first horizontal lines HL1 running through the first optical area OA1 and the second optical area OA2, which is referred to as a first number, may be smaller than the number of subpixels connected to each, or one or more, of the second horizontal lines HL2 disposed only in the non-optical area NA without running through the first optical area OA1 and the second optical area OA2, which is referred to as a second number.

A difference between the first number and the second number may vary according to a difference between a resolution of each of the first optical area OA1 and the second optical area OA2 and a resolution of the non-optical area NA. For example, as a difference between a resolution of each of the first optical area OA1 and the second optical area OA2 and a resolution of the non-optical area NA increases, a difference between the first number and the second number may increase.

As described above, since the number (the first number) of subpixels connected to each, or one or more, of the first horizontal lines HL1 running through the first optical area OA1 and the second optical area OA2 is smaller than the number of subpixels (second number) connected to each, or one or more, of the second horizontal lines HL2 disposed only in the non-optical area NA without running through the first optical area OA1 and the second optical area OA2, an area where the first horizontal line HL1 overlap withs one or more other electrodes or lines adjacent to the first horizontal line HL1 may be smaller than an area where the second horizontal line HL2 overlap withs one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, may be greatly smaller than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance<<second capacitance), a resistance-capacitance (RC) value of the first horizontal line HL1 running through the first optical area OA1 and the second optical area OA2, which is referred to as a first RC value, may be greatly smaller than an RC value of the second horizontal lines HL2 disposed only in the non-optical area NA without running through the first optical area OA1 and the second optical area OA2, which is referred to as a second RC value, that is, resulting in the first RC value<<the second RC value.

Due to such a difference between the first RC value of the first horizontal line HL1 and the second RC value of the second horizontal line HL2, which is referred to as an RC load difference, a signal transmission characteristic through the first horizontal line HL1 may be different from a signal transmission characteristic through the second horizontal line HL2.

FIGS. 6 to 8 are cross-sectional views of the non-optical area NA, the first optical area OA1, and the second optical area OA2 included in the display area DA of the display panel 110 according to aspects of the present disclosure.

FIGS. 6 and 7 are cross-sectional views of the display panel 110 in an example where the touch sensor in the form of a touch panel is disposed outside of the display panel 110. FIG. 8 is a cross-sectional view of the display panel 110 in an example where a touch sensor TS is integrated inside of the display panel 110.

FIGS. 6 to 8 are cross-sectional views of the non-optical area NA, the first optical area OA1, and the second optical area OA2 included in the display area DA.

A stack structure of the non-optical area NA will be described with reference to FIGS. 6 and 7. Respective light emitting areas EA of the first optical area OA1 and the second optical area OA2 may have the same stack structure as the light emitting area EA of the non-optical area NA1.

Referring to FIGS. 6 and 7, a substrate SUB may include a first substrate SUB1, an interlayer insulating layer IPD, and a second substrate SUB2. The interlayer insulating layer IPD may be interposed between the first substrate SUB1 and the second substrate SUB2. As the substrate SUB includes the first substrate SUB1, the interlayer insulating layer IPD, and the second substrate SUB2, the substrate SUB can prevent the penetration of moisture. The first substrate SUB1 and the second substrate SUB2 may be, for example, poly-imide (PI) substrates. The first substrate SUB1 may be referred to as a primary PI substrate, and the second substrate SUB2 may be referred to as a secondary PI substrate. But the aspects of the present disclosure are not limited thereto. For example, the substrate SUB may also include a single substrate, or three or more substrates. And other materials for the substrate are also possible.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 may be disposed on or over the substrate SUB.

Referring to FIGS. 6 and 7, a multi-buffer layer MBUF may be disposed on the second substrate SUB2, and a first active buffer layer ABUF1 may be disposed on the multi-buffer layer MBUF.

A first metal layer ML1 and a second metal layer ML2 may be disposed on the first active buffer layer ABUF1. The first metal layer ML1 and the second metal layer ML2 may be, for example, light shield layers LS for shielding light.

A second active buffer layer ABUF2 may be disposed on the first metal layer ML1 and the second metal layer ML2. An active layer ACT of the driving transistor DRT may be disposed on the second active buffer layer ABUF2.

A gate insulating layer GI may be disposed to cover the active layer ACT.

A gate electrode GATE of the driving transistor DRT may be disposed on the gate insulating layer GI. Further, a gate material layer GM may be disposed on the gate insulating layer GI, together with the gate electrode GATE of the driving transistor DRT, at a location different from the location where the driving transistor DRT is disposed.

A first interlayer insulating layer ILD1 may be disposed to cover the gate electrode GATE and the gate material layer GM. A metal pattern TM may be disposed on the first interlayer insulating layer ILD1. The metal pattern TM may be located at a location different from the location where the driving transistor DRT is formed. A second interlayer insulating layer ILD2 may be disposed to cover the metal pattern TM on the first interlayer insulating layer ILD1.

Two first source-drain electrode patterns SD1 may be disposed on the second interlayer insulating layer ILD2. One of the two first source-drain electrode patterns SD1 may be a source node of the driving transistor DRT, and the other may be a drain node of the driving transistor DRT.

The two first source-drain electrode patterns SD1 may be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping with the gate electrode GATE may serve as a channel region. One of the two first source-drain electrode patterns SD1 may be connected to the first side portion of the channel region of the active layer ACT, and the other of the two first source-drain electrode patterns SD1 may be connected to the second side portion of the channel region of the active layer ACT.

A passivation layer PAS0 may be disposed to cover the two first source-drain electrode patterns SD1. A planariza-tion layer PLN may be disposed on the passivation layer PAS0. The planarization layer PLN may include a first planarization layer PLN1 and a second planarization layer PLN2.

The first planarization layer PLN1 may be disposed on the passivation layer PAS0.

A second source-drain electrode pattern SD2 may be disposed on the first planarization layer PLN1. The second source-drain electrode pattern SD2 may be connected to one of the two first source-drain electrode patterns SD1 (corre-sponding to the second node N2 of the driving transistor DRT in the subpixel SP of FIG. 3) through a contact hole formed in the first planarization layer PLN1.

The second planarization layer PLN2 may be disposed to cover the second source-drain electrode pattern SD2. A light emitting element ED may be disposed on the second pla-narization layer PLN2.

According an example stack structure of the light emitting element ED, an anode electrode AE may be disposed on the second planarization layer PLN2. The anode electrode AE may be electrically connected to the second source-drain electrode pattern SD2 through a contact hole formed in the second planarization layer PLN2.

A bank BANK may be disposed to cover a portion of the anode electrode AE. A portion of the bank BANK corre-sponding to a light emitting area EA of the subpixel SP may be opened.

A portion of the anode electrode AE may be exposed through the opening (the opened portion) of the bank BANK. An emission layer EL may be positioned on side surfaces of the bank BANK and in the opening (the opened portion) of the bank BANK. All or at least a portion of the emission layer EL may be located between adjacent banks.

In the opening of the bank BANK, the emission layer EL may contact the anode electrode AE. A cathode electrode CE may be disposed on the emission layer EL.

The light emitting element ED can be formed by includ-ing the anode electrode AE, the emission layer EL, and the cathode electrode CE, as described above. The emission layer EL may include an organic layer.

An encapsulation layer ENCAP may be disposed on the stack of the light emitting element ED.

The encapsulation layer ENCAP may have a single-layer structure or a multi-layer structure. For example, as shown in FIGS. 6 and 7, the encapsulation layer ENCAP may include a first encapsulation layer PAS1, a second encapsulation layer PCL, and a third encapsulation layer PAS2.

The first encapsulation layer PAS1 and the third encapsulation layer PAS2 may be, for example, an inorganic layer, and the second encapsulation layer PCL may be, for example, an organic layer. Among the first encapsulation layer PAS1, the second encapsulation layer PCL, and the third encapsulation layer PAS2, the second encapsulation layer PCL may be the thickest and serve as a planarization layer.

The first encapsulation layer PAS1 may be disposed on the cathode electrode CE and may be disposed closest to the light emitting element ED. The first encapsulation layer PAS1 may include an inorganic insulating material capable of being deposited using low-temperature deposition. For example, the first encapsulation layer PAS1 may include, but not limited to, one of silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL may have a smaller area or size than the first encapsulation layer PAS1. For example, the second encapsulation layer PCL may be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL may include an organic insulating material, such as acrylic resin, epoxy resin, polyimide, polyethylene, silicon oxycarbon (SiOC), or the like. The second encapsulation layer PCL may be disposed, for example, using an inkjet scheme.

The third inorganic encapsulation layer PAS2 may be disposed over the substrate SUB over which the second encapsulation layer PCL is disposed such that the third inorganic encapsulation layer PAS2 covers the respective top surfaces and side surfaces of the second encapsulation layer PCL and the first encapsulation layer PAS1. The third encapsulation layer PAS2 can minimize or prevent external moisture or oxygen from penetrating into the first inorganic encapsulation layer PAS1 and the organic encapsulation layer PCL. For example, the third encapsulation layer PAS2 may include an inorganic insulating material, such as silicon nitride (SiNx), silicon oxide (SiOx), silicon oxynitride (SiON), aluminum oxide (Al2O3), or the like.

Next, a stack structure of the first optical area OA1 will be described with reference to FIGS. 6 and 7.

Referring to FIG. 6, a third substrate SUB3 may be disposed in the first optical area OA1.

The material of the third substrate SUB3 may be different from respective materials of the first and second substrates SUB1 and SUB2. For example, the third substrate SUB3 may be a glass substrate.

The transmittance of the third substrate SUB3 may be higher than those of the first and second substrates SUB1 and SUB2.

As the third substrate SUB3 is disposed to correspond to the first optical area OA1, therefore, the third substrate SUB3 may overlap with the first transmission area TA1.

The first optical area OA1 may be an area requiring a higher transmittance than the second optical area OA2 and the non-optical area NA.

Thus, as the third substrate SUB3 disposed to correspond to the first optical area OA1 has a transmittance higher than the first and second substrates SUB1 and SUB2 disposed to correspond to the second optical area OA2 and the non-optical area NA, the transmittance of the first optical area OA1 may be higher than those of the second optical area OA2 and the non-optical area NA.

In an example where the same substrate as the first and second substrates SUB1 and SUB2 is used in the first optical area OA1, since the colors of the first and second substrates SUB1 and SUB2 are not transparent, the transmittance of the first optical area OA1 may be reduced.

In an example where transparent polyimide is applied to the first optical area OA1, heat resistance may be lowered, and in turn, the substrate SUB may be damaged (floating of the substrate) due to heat generated in the process of forming a plurality of insulating layers and electrodes disposed on the substrate SUB, or a process defect can be caused by impurities generated from the substrate SUB.

Thus, by applying the third substrate SUB3 having a high transmittance to the area desired to have such a high transmittance, the transmittance of at least a portion of the third substrate SUB3 can be increased, and it is possible to prevent the substrate SUB from being damaged due to heat generated in the process of forming a plurality of insulating layers and electrodes disposed on the substrate SUB. Further, the display device 100 unaffected by being bent and/or folded can be provided as the first and second substrates SUB1 and SUB2 having excellent bending or folding characteristics are applied in the area except for the area desired to have the high transmittance.

A first bonding layer 650 may be disposed on at least one surface of the third substrate SUB3.

For example, the first bonding layer 650 may be disposed on at least one side surface and the top surface of the third substrate SUB3.

However, aspects of the present disclosure for the location of the first bonding layer 650 are not limited thereto. For example, the first bonding layer 650 may be disposed only on at least one side surface of the third substrate SUB3, or disposed on all or a portion of at least one side surface and all or a portion of the top surface of the third substrate SUB3.

As shown in FIG. 6, at least a portion of the first bonding layer 650 may be disposed in the non-optical area NA. For example, the first bonding layer 650 coupled to at least one side surface or portion of the third substrate SUB3 may be located in the non-optical area. This example may correspond to the structures of FIGS. 1A and 1B in the display device 100 according to aspects of the present disclosure; however, aspects of the present disclosure are not limited thereto.

The first bonding layer 650 may serve to connect respective at least one side surface of the first substrate SUB1, the interlayer insulating layer IPD, and the second substrate SUB2 disposed in the non-optical area NA or the second optical area OA2 located around the first optical area OA1, and at least one side surface of the third substrate SUB3.

The material of the first bonding layer 650 may be a material including an amino group.

The material of the first bonding layer 650 may be coupled to one side surface of the third substrate SUB3, and the amino group of the material of the first bonding layer 650 may be coupled to respective at least one side surface of the first substrate SUB1 and the second substrate SUB2 adjacent to the third substrate SUB3.

Oxygen of the first bonding layer 650 may be coupled to the third substrate SUB3.

In the example where the first substrate SUB1 and the second substrate SUB2 are polyimide substrates, the amino group of the first bonding layer 650 may be coupled to the imide rings of the first and second substrates SUB1 and SUB2.

Thus, the third substrate SUB3 may not be separated as the third substrate SUB3 is coupled to the first substrate SUB1 and the second substrate SUB2 by the first bonding layer 650.

Further, the third substrate SUB3 having a transmittance higher than the first and second substrates SUB1 and SUB2 may be disposed to correspond to all of the first optical area OA.

Referring to FIG. 7, the third substrate SUB3 may be disposed to extend up to at least a portion of the second optical area OA2, as well as the first optical area OA1.

For example, the third substrate SUB3 may correspond to a portion of the second optical area OA2, but may not overlap with the second transmission area TA2.

However, aspects of the present disclosure are not limited thereto. For example, the third substrate SUB3 may be disposed to correspond to all of the second optical area OA2.

The first bonding layer 650 may be disposed on at least one side of the third substrate SUB3 extended up to at least a portion of the second optical area OA2. For example, as shown in FIG. 7, the first bonding layer 650 may be disposed only on at least one side surface of the third substrate SUB3, or may be disposed on all or a portion of at least one side surface and all or a portion of the top surface, of the third substrate SUB3.

The first bonding layer 650 may overlap with a portion of the second optical area OA2, but may not overlap with the second transmission area TA2.

Although FIG. 7 illustrates a structure in which the third substrate SUB3 is disposed only in a portion of the second optical area OA2; however, aspects of the present disclosure are not limited thereto. In examples where the second optical area OA2 is desired to have a high transmittance, the third substrate SUB3 may be disposed to correspond to all of the second optical area OA2.

Thus, since the third substrate SUB3 is disposed to extend up to at least a portion of the second optical area OA2, even though a process error occurs, the third substrate has a transmittance higher than the first and second substrates SUB1 and SUB2. The third substrate SUB3 may be disposed to overlap with all of the first optical area OA.

Even in this example, the first bonding layer 650 may be disposed on at least one side of the third substrate SUB3, enabling the third substrate SUB3 and the first and second substrates SUB1 and SUB2 to be coupled to each other.

Referring to FIGS. 6 and 7, the light emitting area EA of the first optical area OA1 may have the same stack structure as that in the non-optical area NA. Accordingly, in the discussion that follows, instead of repeatedly describing the light emitting area EA in the first optical area OA1, a stack structure of the first transmission area TA1 in the first optical area OA1 will be described in detail below.

The cathode electrode CE may be disposed in the light emitting areas EA included in the non-optical area NA and the first optical area OA1, but may not be disposed in the first transmission area TA1 in the first optical area OA1. For example, the first transmission area TA1 in the first optical area OA1 may correspond to an opening of the cathode electrode CE.

Further, a light shield layer LS including at least one of the first metal layer ML1 and the second metal layer ML2 may be disposed in the light emitting areas EA included in the non-optical area NA and the first optical area OA1, but may not be disposed in the first transmission area TA1 in the first optical area OA1. For example, the first transmission area TA1 in the first optical area OA1 may correspond to an opening of the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the non-optical area NA and the first optical area OA1 may be disposed in the first transmission area TA1 in the first optical area OA1 equally, substantially equally, or similarly.

However, all, or one or more, of one or more material layers having electrical properties (e.g., a metal material layer, a semiconductor layer, etc.), except for the insulating materials or layers, disposed in the light emitting areas EA included in the non-optical area NA and the first optical area OA1 may not be disposed in the first transmission area TA1 in the first optical area OA1.

For example, referring to FIGS. 6 and 7, all, or one or more, of the metal material layers (ML1, ML2, GATE, GM, TM, SD1, SD2) related to at least one transistor and the semiconductor layer ACT may not be disposed in the first transmission area TA1.

Further, referring to FIGS. 6 and 7, the anode electrode AE and the cathode electrode CE included in the light emitting element ED may not be disposed in the first transmission area TA1. In some aspects, the emission layer EL of the light emitting element ED may or may not be disposed in the first transmission area TA1 according to a design requirement.

Accordingly, the light transmittance of the first transmission area TA1 in the first optical area OA1 can be provided or improved because the material layers (e.g., the metal material layer, the semiconductor layer, etc.) having electrical properties are not disposed in the first transmission area TA1 in the first optical area OA1. As a consequence, the first optical electronic device 11 can perform a predefined function (e.g., image sensing) by receiving light transmitting through the first transmission area TA1.

Since all, or one or more, of the first transmission area TA1 in the first optical area OA1 overlap with the first optical electronic device 11, for enabling the first optical electronic device 11 to normally operate, it is necessary to further increase a transmittance of the first transmission area TA1 in the first optical area OA1.

To do this, in some aspects, the first transmission area TA1 formed in the first optical area OA1 of the display panel 110 of the display device 100 may have a transmittance improvement structure TIS.

Referring to FIGS. 6 and 7, the plurality of insulating layers included in the display panel 110 may include at least one buffer layer (MBUF, ABUF1, ABUF2) between at least one substrate (SUB1, SUB2) and at least one transistor (DRT, SCT), at least one planarization layers (PLN1, PLN2) between the transistor DRT and the light emitting element ED, at least one encapsulation layer ENCAP on the light emitting element ED, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 may include at least one depression (or recess, trench, concave, protrusion, etc.). The first planarization layer PLN1 may be, for example, an organic insulating layer.

In the example where the first planarization layer PLN1 has the depressed portion that extends downward from the surfaces thereof, the second planarization layer PLN2 can substantially serve to planarize. In one aspect, the second planarization layer PLN2 may also have a depressed portion that extends downward from the surface thereof. In this aspect, the second encapsulation layer PCL can substantially serve to planarize.

Referring to FIGS. 6 and 7, the depressed portions of the first planarization layer PLN1 and the passivation layer PAS0 may pass through insulating layers, such as the first interlayer insulating layer ILD, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2.

Referring to FIGS. 6 and 7, the substrate SUB may include at least one concave portion or depressed portion as a transmittance improvement structure TIS. For example, in the first transmission area TA1, an upper portion of the second substrate SUB2 may be indented or depressed downward, or the second substrate SUB2 may be perforated.

Referring to FIGS. 6 and 7, the first encapsulation layer PAS1 and the second encapsulation layer PCL included in the encapsulation layer ENCAP may also have a transmittance improvement structure TIS in which the first encapsulation layer PAS1 and the second encapsulation layer PCL have depressed portions that extend downward from the respective surfaces thereof. The second encapsulation layer PCL may be, for example, an organic insulating layer.

Referring to FIGS. 6 and 7, the light emitting area EA of the second optical area OA2 may have the same stack structure as that of the non-optical area NA. Accordingly, in the discussion that follows, instead of repeatedly describing the light emitting area EA in the second optical area OA2, a stack structure of the second transmission area TA2 in the second optical area OA21 will be described in detail below.

The cathode electrode CE may be disposed in the light emitting areas EA included in the non-optical area NA and the second optical area OA2, but may not be disposed in the second transmission area TA2 in the second optical area OA2. For example, the second transmission area TA2 in the second optical area OA2 may be corresponded to an opening of the cathode electrode CE.

Further, a light shield layer LS including at least one of the first metal layer ML1 and the second metal layer ML2 may be disposed in the light emitting areas EA included in the non-optical area NA and the second optical area OA2, but may not be disposed in the first transmission area TA2 in the second optical area OA2. For example, the second transmission area TA2 in the second optical area OA2 may be corresponded to an opening of the light shield layer LS.

In an example where the transmittance of the second optical area OA2 and the transmittance of the first optical area OA1 are the same, the stack structure of the second transmission area TA2 in the second optical area OA2 may be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 may be different in at least a part from as the stacked structure of the first transmission area TA1 in the first optical area OA1.

For example, as shown in FIGS. 6 and 7, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed. Further, a width of the second transmission area TA2 in the second optical area OA2 may be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the non-optical area NA and the second optical area OA2 may be disposed in the second transmission area TA2 in the second optical area OA2 equally, substantially equally, or similarly.

However, all, or one or more, of one or more material layers having electrical properties (e.g., a metal material layer, a semiconductor layer, etc.), except for the insulating materials or layers, disposed in the light emitting areas EA included in the non-optical area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the semiconductor layer ACT may not be disposed in the second transmission area TA2 in the second optical area OA2.

Further, referring to FIGS. 6 and 7, the anode electrode AE and the cathode electrode CE included in the light emitting element ED may not be disposed in the second transmission area TA2. In some aspects, the emission layer EL of the light emitting element ED may or may not be disposed on the second transmission area TA2 according to a design requirement.

Referring to FIG. 8, in the example where a touch sensor TS is embedded into the display panel 110, the touch sensor TS may be disposed on the encapsulation layer ENCAP. The structure disposed under the encapsulation layer ENCAP has been described with reference to FIG. 6; however, aspects of the present disclosure are not limited thereto. The structure disposed under the encapsulation layer ENCAP illustrated in FIG. 8 may be substantially, or nearly, equal to the structure of FIG. 7.

Hereinafter, the structure of the touch sensor of FIG. 8 will be described in detail.

Referring to FIG. 8, in the example where the touch sensor TS is embedded into the display panel 110, the touch sensor TS may be disposed on the encapsulation layer ENCAP. The structure of the touch sensor will be described in detail as follows.

A touch buffer layer T-BUF may be disposed on the encapsulation layer ENCAP in the non-optical area NA, the first optical area OA1, and the second optical area OA2. The touch sensor TS may be disposed on the touch buffer layer T-BUF.

The touch sensor TS may include touch sensor metals TSM and at least one bridge metal BRG, which are located in different layers.

A touch interlayer insulating layer T-ILD may be disposed between the touch sensor metals TSM and the bridge metal BRG.

For example, the touch sensor metals TSM may include a first touch sensor metal TSM, a second touch sensor metal TSM, and a third touch sensor metal TSM, which are disposed adjacent to one another. In an aspect where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM may be electrically connected to each other through the bridge metal BRG located in a different layer. The bridge metal BRG may be electrically insulated from the third touch sensor metal TSM by the touch interlayer insulating layer T-ILD.

While the touch sensor TS is disposed on the display panel 110, a chemical solution (developer or etchant, etc.) used in the corresponding process or moisture from the outside may be generated or introduced. By disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined temperature (e.g. 100 degrees (° C.)) and be formed using an organic insulating material having a low permittivity of 1 to 3. For example, the touch buffer layer T-BUF may include an acrylic-based, epoxy-based, or siloxan-based material. As the display device 100 is bent, the encapsulation layer ENCAP may be damaged, and the touch sensor metal located on the touch buffer layer T-BUF may be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC may be disposed to cover the touch sensor TS. The protective layer PAC may be, for example, an organic insulating layer.

The touch sensor metal TSM and the bridge metal BRG included in the touch sensor TS may not be disposed in the first transmission area TA1 in the first optical area OA1.

To protect the touch sensor TS, the protective layer PAC may be disposed to cover the touch sensor TS on the encapsulation layer ENCAP.

Referring to FIG. 8, the protective layer PAC may have at least one depression (or recess, trench, concave, protrusion, etc.) as a transmittance improvement structure TIS in a portion overlapping with the first transmission area TA1. The protective layer PAC may be, for example, an organic insulating layer.

Referring to FIG. 8, the touch sensor TS may include one or more touch sensor metals TSM with a mesh type. In the example where the touch sensor metal TSM is formed in the mesh type, a plurality of openings may be formed in the touch sensor metal TSM. Each of the plurality of openings may be located to correspond to the light emitting area EA of the subpixel SP.

In order for the first optical area OA1 to have a transmittance higher than the non-optical area NA, an area or size of the touch sensor metal TSM per unit area in the first optical area OA1 may be smaller than an area or size of the touch sensor metal TSM per unit area in the non-optical area NA.

Referring to FIG. 8, the touch sensor TS may be disposed in the light emitting area EA in the first optical area OA1, but may not be disposed in the first transmission area TA1 in the first optical area OA1. Further, the touch sensor metal TSM and the bridge metal BRG included in the touch sensor TS may not be disposed in the first transmission area TA1 in the first optical area OA1.

The touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the material layers (e.g., the metal material layer, the semiconductor layer, etc.) having electrical properties are not disposed in the second transmission area TA2 in the second optical area OA2. As a consequence, the second optical electronic device 12 can perform a predefined function (e.g., approach detection of an object or human body, external illumination detection, etc.) by receiving light transmitting through the second transmission area TA2.

FIG. 9 is a cross-sectional view in an outer edge of the display panel 110 according to aspects of the present disclosure.

For simplicity, FIG. 9 illustrates a single substrate SUB including the first substrate SUB1 and the second substrate SUB2, and layers or portions located under the bank BANK are shown in a simplified structure as well. Likewise, FIG. 9 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 9, the first encapsulation layer PAS1 may be disposed on the cathode electrode CE and disposed closest to the light emitting element ED. The second encapsulation layer PCL may have a smaller area or size than the first encapsulation layer PAS1. For example, the second encapsulation layer PCL may be disposed to expose both ends or edges of the first encapsulation layer PAS1.

The third inorganic encapsulation layer PAS2 may be disposed over the substrate SUB over which the second encapsulation layer PCL is disposed such that the third inorganic encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first inorganic encapsulation layer PAS1 and the organic encapsulation layer PCL.

Referring to FIG. 9, in order to prevent the encapsulation layer ENCAP from collapsing, the display panel 110 may include one or more dams (DAM1, DAM2) at, or near to, an end or edge of an inclined surface SLP of the encapsulation layer ENCAP. The one or more dams (DAM1, DAM2) may be present at, or near to, a boundary point between the display area DA and the non-display area NDA.

The one or more dams (DAM1, DAM2) may include the same material DFP as the bank BANK.

Referring to FIG. 9, in one aspect, the second encapsulation layer PCL including an organic material may be located only on an inner side of a first dam DAM1, which is located closest to the inclined surface SLP of the encapsulation layer ENCAP among the dams. For example, the second encapsulation layer PCL may not be located on all of the dams (DAM1, DAM2). In another aspect, the second encapsulation layer PCL including an organic material may be located on at least the first dam DAM1 of the first dam DAM1 and a second dam DAM2.

For example, the second encapsulation layer PCL may extend only up to all, or at least a portion, of an upper portion of the first dam DAM1. In further another aspect, the second encapsulation layer PCL may extend past the upper portion of the first dam DAM1 and extend up to all, or at least a portion of, an upper portion of the secondary dam DAM2.

Referring to FIG. 9, a touch pad TP, to which the touch driving circuit 260 is electrically connected, may be disposed on a portion of the substrate SUB outside of the one or more dams (DAM1, DAM2).

A touch line TL can electrically connect, to the touch pad TP, the touch sensor metal TSM or the bridge metal BRG included in, or serving as, a touch electrode disposed in the display area DA.

One end or edge of the touch line TL may be electrically connected to the touch sensor metal TSM or the bridge metal BRG, and the other end or edge of the touch line TL may be electrically connected to the touch pad TP.

The touch line TL may run downward along the inclined surface SLP of the encapsulation layer ENCAP, run along the respective upper portions of the dams DAM1, DAM2, and extend up to the touch pad TP disposed outside of the dams (DAM1, DAM2).

Referring to FIG. 9, in one aspect, the touch line TL may be the bridge metal BRG. In another aspect, the touch line TL may be the touch sensor metal TSM.

FIGS. 10 to 17 illustrate processes of forming the substrate in the display device 100 according to aspects of the present disclosure.

Figure 10:
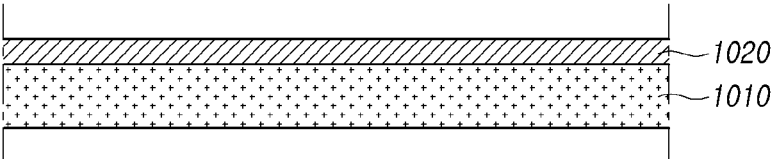

Referring to FIG. 10, a sacrificial layer 1020 may be disposed on a support layer 1010. The support layer 1010 may be glass, and the sacrificial layer 1020 may be an amorphous silicon (a-Si) layer; however, aspects of the present disclosure are not limited thereto.

Thereafter, a surface treatment of the sacrificial layer 1020 may be carried out using plasma or UV. The sacrificial layer 1020 to which the surface treatment has been applied may be in a state in which a ligand is formed to improve adhesion with a different material. For example, an oxygen ligand may be formed in the sacrificial layer 1020.

Figure 11:
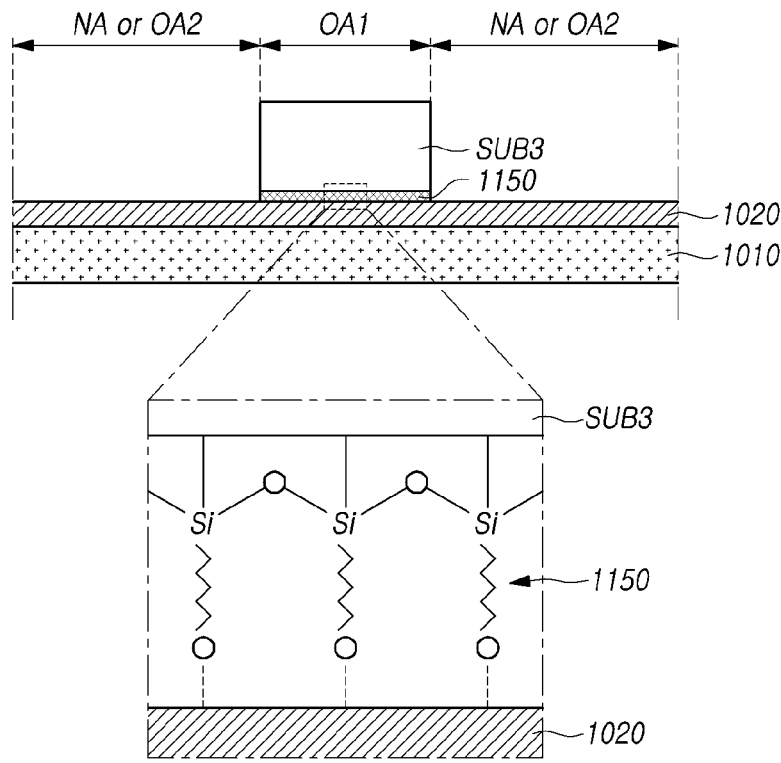

As shown in FIG. 11, the material of a second bonding layer 1150 may be deposited on the sacrificial layer 1020.

The material of the second bonding layer 1150 may include a silane coupling agent.

The material of the second bonding layer 1150 may correspond to the material of the first bonding layer 650 described with reference to FIGS. 6 to 8.

For example, the material of the second bonding layer 1150 may include an amino silane-based material.

The second bonding layer 1150 may be coupled through the oxygen ligand of the sacrificial layer 1020. Further, a third substrate SUB3 may be coupled through oxygen in the second bonding layer 1150.

The third substrate SUB3 may be disposed on the second bonding layer 1150.

The second bonding layer 1150 may serve to couple the third substrate SUB3 to the sacrificial layer 1020.

A width of the second bonding layer 1150 may correspond to a width of the third substrate SUB3. The width of the second bonding layer 1150 and the width of the third substrate SUB3 may mean lengths in a direction perpendicular to a direction in which the sacrificial layer 1020 is stacked on the support layer 1010.

Meanwhile, an area in which the third substrate SUB3 is disposed may include an area corresponding to the first optical area OA1.

For example, as shown in FIG. 11, the area in which the third substrate SUB3 is disposed and the first optical area OA1 may correspond to each other.

However, aspects of the present disclosure are not limited thereto. For example, the area in which the third substrate SUB3 is disposed may correspond to the first optical area OA1 and a portion of the non-optical area NA located around the first optical area OA1. The area in which the third substrate SUB3 is disposed may correspond to the first optical area OA1 and a part or all of the second optical area OA2.

In an example where the area in which the third substrate SUB3 is disposed and the first optical area OA1 correspond to each other, the remaining area except for the area on which the third substrate SUB3 is disposed may correspond to the non-optical area NA and the second optical area OA2.

In another example where the area in which the third substrate SUB3 is disposed corresponds to the first optical area OA1 and a portion of the non-optical area NA located around the first optical area OA1, the remaining area except for the area in which the third substrate SUB3 is disposed may correspond to a portion of the non-optical area NA and the second optical area OA2.

In further another example where the area in which the third substrate SUB3 is disposed corresponds to the first optical area OA1 and a portion of the second optical area OA2, the remaining area except for the area in which the third substrate SUB3 is disposed may correspond to a portion of the second optical area OA2 and the non-optical area NA. In still further example where the area in which the third substrate SUB3 is disposed corresponds to all of the first optical area OA1 and all of the second optical area OA2, the remaining area except for the area on which the third substrate SUB3 is disposed may correspond to the non-optical area NA.

Figure 12A:
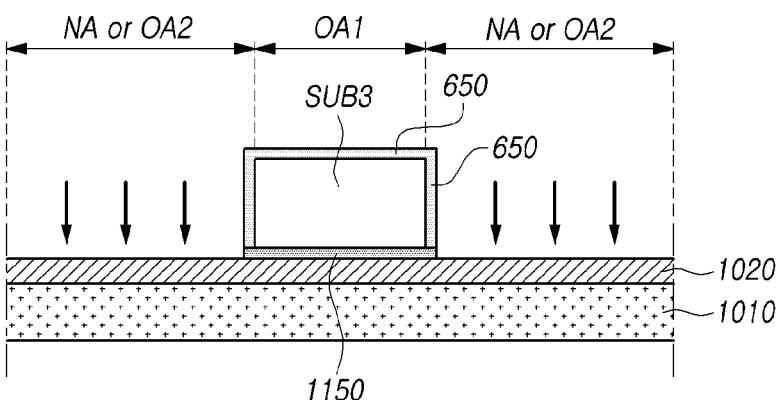
Figure 12B:
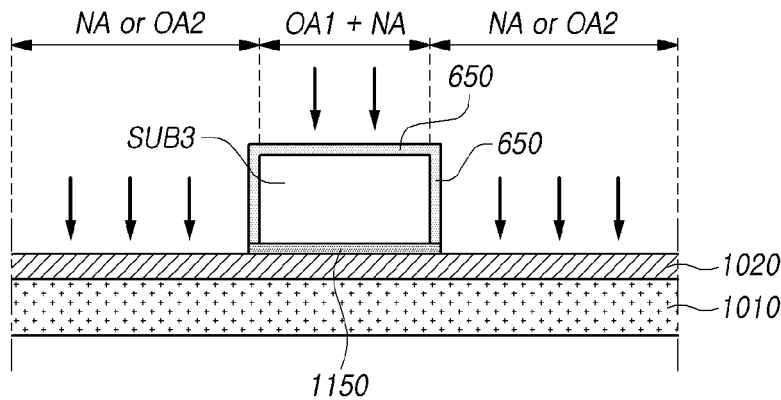
Figure 12C:
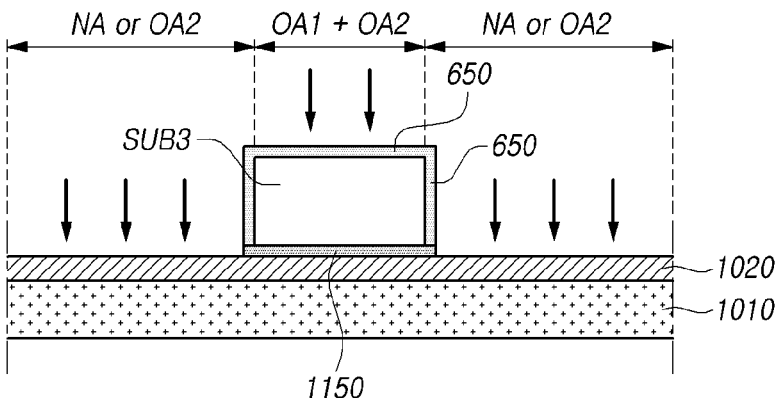

As shown in FIGS. 12A to 12C, a first bonding layer 650 may be disposed on at least one side of the third substrate SUB3.

For example, the first bonding layer 650 may be disposed on all, or at least a portion, of at least one side surface and all, or at least a portion, of the top surface of the third substrate SUB3.

Thereafter, as shown in FIGS. 12A to 12C, a surface treatment may be carried out on the top surface of the first bonding layer 650 and the top surface of the sacrificial layer 1020 on which the third substrate SUB3 is disposed using plasma or UV.

Specifically, the surface treatment of the sacrificial layer 1020 may be carried out in the remaining area except for the area in which the third substrate SUB3 is disposed, and the surface treatment may be carried out on the entire top surface of the first bonding layer 650.

As shown in FIG. 12A, in the example where an area in which the third substrate SUB3 is disposed and the first optical area OA1 correspond to each other (e.g., the structure of FIG. 11), a portion of the first bonding layer 650 disposed on the top surface of the third substrate SUB3 may be disposed to correspond to the first optical area OA1, and a portion of the first bonding layer 650 disposed on at least one side surface of the third substrate SUB3 may be disposed to correspond to the non-optical area NA or the second optical area OA2.

However, aspects of the present disclosure are not limited thereto. For example, as shown in FIG. 12B, in the example where an area in which the third substrate SUB3 is disposed corresponds to the first optical area OA1 and a portion of the non-optical area NA located around the first optical area OA1, a portion of the first bonding layer 650 disposed on the top surface of the third substrate SUB3 may be disposed to correspond to the first optical area OA1 and the portion of the non-optical area NA located around the first optical area OA1, and a portion of the first bonding layer 650 disposed on at least one side surface of the third substrate SUB3 may be disposed to correspond to the non-optical area NA or the second optical area OA2.

Further, as shown in FIG. 12C, in the example where an area on which the third substrate SUB3 is disposed corresponds to the first optical area OA1 and at least a portion of the second optical area OA2, a portion of the first bonding layer 650 disposed on the upper surface of the third substrate SUB3 may be disposed to correspond to the first optical area OA1 and the portion of the second optical area OA2, and a portion of the first bonding layer 650 disposed on at least one side surface of the third substrate SUB3 may be disposed to correspond to at least one of the second optical area OA2 and the non-optical area NA.

Further, in the example where the first optical area OA1 and the second optical area OA2 are spaced apart from each other as shown in FIG. 1B, the third substrate SUB3 may be not only disposed to correspond to the first optical area OA1 and the second optical area OA2, but also disposed in the non-optical area NA between the first optical area OA1 and the second optical area OA2. For example, the first bonding layer 650 disposed on the top surface of the third substrate SUB3 may be disposed to overlap with the first optical area OA1, at least a portion of the non-optical area NA, and at least a portion of the second optical area OA2.

Thus, according to aspects of the present disclosure, since the third substrate SUB3 is disposed not only in the first optical area OA1 but also in the second optical area OA2, it is possible to adjust transmittance for each area.

Figure 13:
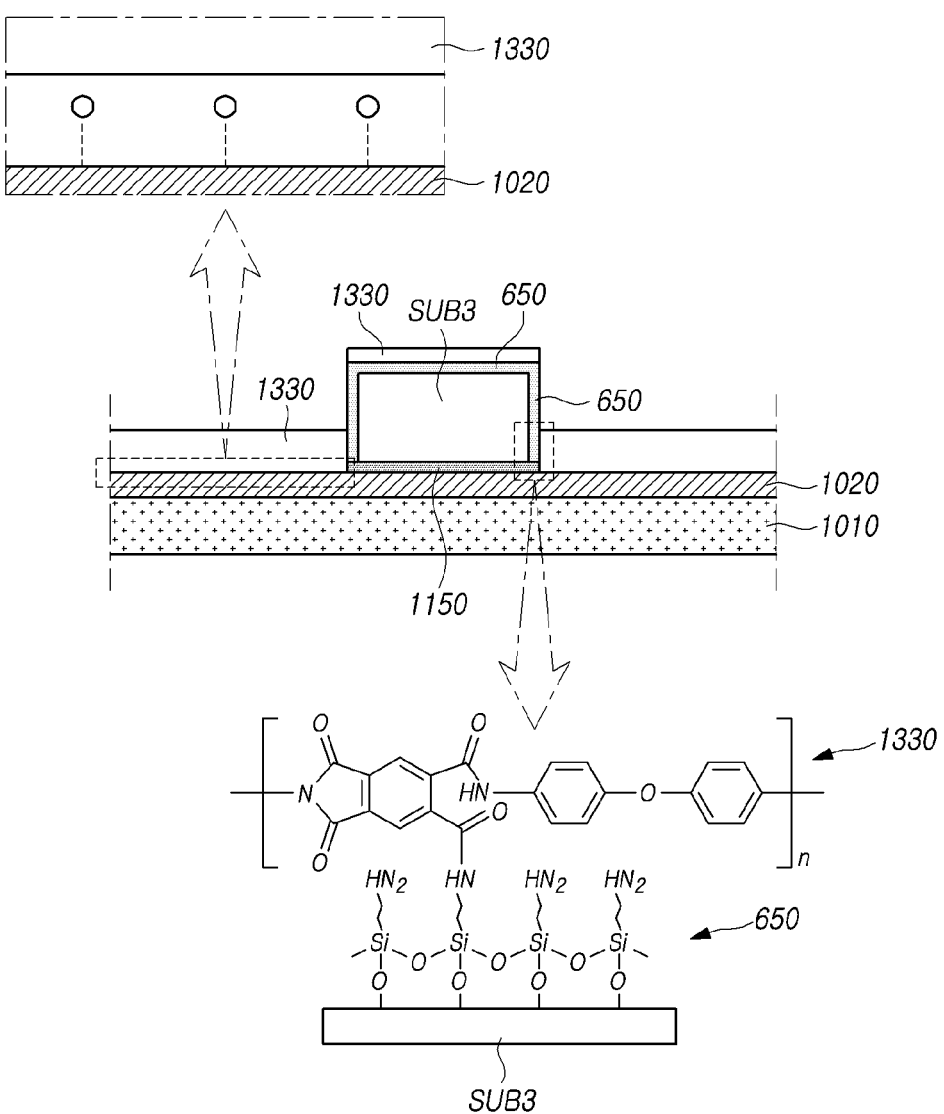

Referring to FIG. 13, a first substrate material 1330 may be disposed on the sacrificial layer 1020 on which the surface treatment has been carried out and the first bonding layer 650.

The material of the first substrate SUB1 may be polyimide PI.

A thickness of the first substrate material 1330 disposed on the top surface of the sacrificial layer 1020 may be greater than a thickness of the first substrate material 1330 disposed on the top surface of the third substrate SUB3 and the first bonding layer 650. However, the first substrate material 1330 according to aspects of the present disclosure are not limited thereto, and for example, may have various thicknesses in one or more locations.

In an example where an apparatus or equipment for depositing the first substrate material 1330 has a capability of recognizing a height of an object on which the material is deposited and adjusting an amount of the material to be sprayed, a small amount of the material may be sprayed in a portion of the object having a relatively large height and a large amount of material may be sprayed in a portion of the object having a relatively small height.

For example, since the area in which the third substrate SUB3 and the first bonding layer 650 are disposed has a height greater than one or more other areas, a small amount of the first substrate material 1330 may be sprayed in such an area. Thus, a thickness of the first substrate material 1330 disposed on the top surface of the first bonding layer 160 and the third substrate SUB3 may be smaller than a thickness of the first substrate material 1330 disposed on the top surface of the sacrificial layer 1020.

The first substrate material 1330 may be coupled to the sacrificial layer 1020 on which the surface treatment has been carried out and the first bonding layer 650.

For example, as shown in FIG. 13, the sacrificial layer 1020 and the first substrate material 1330 can be coupled to each other through oxygen ligands of the sacrificial layer 1020 generated by the surface treatment. In this situation, the oxygen ligand of the sacrificial layer 1020 and the sacrificial layer 1020 can be coupled to each other due to electron attraction.

Further, the oxygen ligand of the first bonding layer 650 can be coupled to the third substrate SUB3, and the amino group of the first bonding layer 650 can be coupled to the first substrate material 1330.

Figure 14:
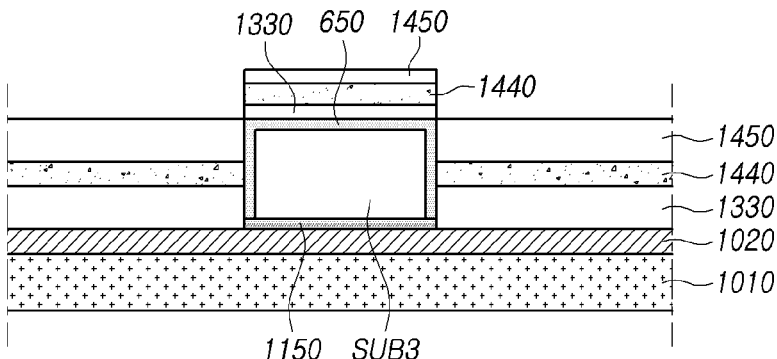

Thereafter, as shown in FIG. 14, an interlayer insulating layer material 1440 may be disposed on the sacrificial layer 1020 on which the first substrate material 1330 is disposed.

A second substrate material 1450 may be disposed on the sacrificial layer 1020 on which the interlayer insulating layer material 1440 is disposed.

A thickness of the second substrate material 1450 on the sacrificial layer 1020 may be greater than a thickness of the second substrate material 1450 disposed over the first bonding layer 650. However, the thickness of the second substrate material 1450 according to aspects of the present disclosure are not limited thereto.

Figure 15:
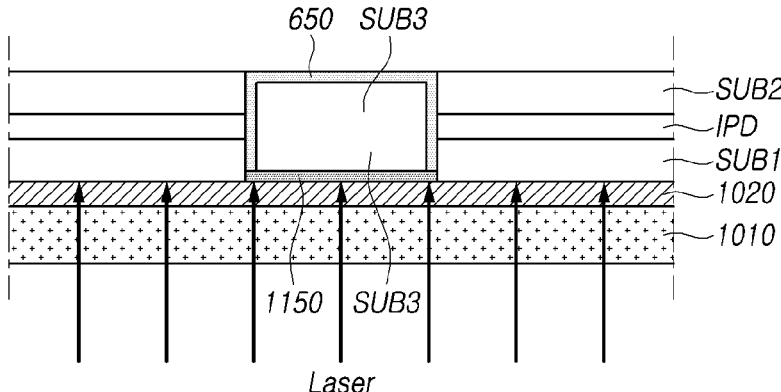

Referring to FIG. 15, the first substrate material 1330, the interlayer insulating layer material 1440, and the second substrate material 1450 disposed on the third substrate SUB3 and the first bonding layer 650 may be removed to planarize the surface of the substrates used in the display device. To do this, a dry etching process may be used, but aspects of the present disclosure are not limited thereto.

By removing the first substrate material 1330, the interlayer insulating layer material 1440, and the second substrate material 1450 disposed on the third substrate SUB3 and the first bonding layer 650, the first to third substrates SUB1, SUB2 and SUB3, the interlayer insulating layer IPD, and the first bonding layer 650 can be disposed on the sacrificial layer 1020.

Thereafter, a laser may be irradiated to separate the support layer 1010 and the sacrificial layer 1020 from the first substrate SUB1 and the third substrate SUB3.

Figure 16:
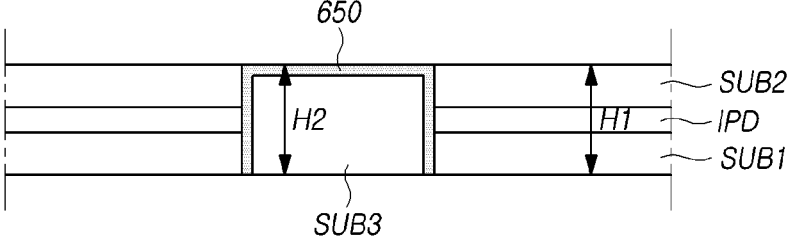

Through this, the sacrificial layer 1020 and the second bonding layer 1150 can be separated from the first substrate SUB1 and the third substrate SUB3, and thus, a substrate SUB including the first substrate SUB1, the second substrate SUB2, the third substrate SUB3, the interlayer insulating layer IPD, and the first bonding layer 650 can be formed as shown in FIG. 16.

In some instances, a portion of the second bonding layer 1150 may remain on the rear surface of the third substrate SUB3.

The sum H1 of respective heights of the first substrate SUB1, the interlayer insulating layer IPD, and the second substrate SUB2 may be substantially equal to the sum H1 respective heights of the third substrate SUB3 and the first bonding layer 650 disposed on the third substrate SUB3. This results in the top surface of the substrate SUB being planarized.

Figure 17:
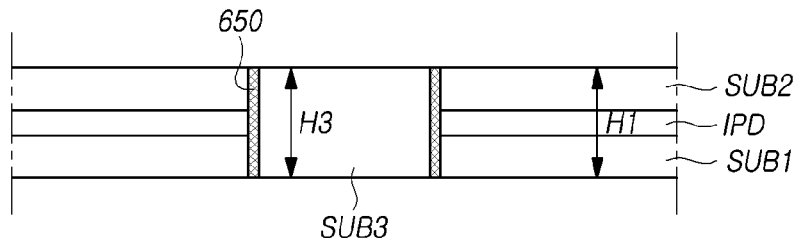

In some aspects, in the process of removing the first substrate material 1330, the interlayer insulating film material 1440, and the second substrate material 1450 disposed on the top surface of the first bonding layer 650 of FIG. 15, a portion of the second substrate material 1450 and the first bonding layer 650 disposed on the third substrate SUB3 may be removed, and thus, as shown in FIG. 17, the first bonding layer 650 may not be present on the third substrate SUB3.

In this example, the first bonding layer 650 may be disposed only at boundaries between the third substrate SUB3, the first substrate SUB1, the interlayer insulating layer IPD, and the second substrate SUB2.

In one example, the sum H1 of respective heights of the first substrate SUB1, the interlayer insulating layer IPD, and the second substrate SUB2 may correspond to the height H3 of the third substrate SUB3. This results in the top surface of the substrate SUB being planarized.

The height H3 of the third substrate SUB3 may be greater than or equal to 30 µm in which the third substrate SUB3 may be successfully manufactured, but aspects of the present disclosure are not limited thereto.

As such, as the first bonding layer 650 is disposed at the boundaries between the third substrate SUB3, the first substrate SUB1, the interlayer insulating layer IPD, and the second substrate SUB2, therefore, the third substrate SUB3 can be fixed so as not to be separated from the first substrate SUB1, the interlayer insulating layer IPD, and the second substrate SUB2.

For example, the second bonding layer 650 may have a structure in which the second bonding layer 650 is coupled to the third substrate SUB3 and each of the first substrate SUB1, the interlayer insulating layer IPD, and the second substrate SUB2, such that at least one side of the second bonding layer 650 is coupled to the substrate SUB3, and the other side of the second bonding layer 650 is coupled or coated to respective at least one side of the first substrate SUB1, the interlayer insulating layer IPD, and the second substrate SUB2.

FIG. 18 illustrates the transmittance of light with respect to each wavelength in comparative examples 1, 2, and an aspect in the display device according to aspects of the present disclosure.

In FIG. 18, a display device of Comparative Example 1 may include a first optical area, a second optical area, and a non-optical area which include first and second substrates; a display device of Comparative Example 2 may include a transparent first optical area, a second optical area, and a non-optical area, which include a transparent resin substrate; and a display device according to Aspect may be a display device having the structure shown in FIG. 6.

Referring to FIG. 18, it can be seen that the display device of the Aspect to which the third substrate is applied has the highest transmittance at respective wavelengths of 430 nm, 470 nm, 555 nm, and 650 nm.

In particular, the transmittance of the display device of the Aspect with respect to light having a short wavelength of 430 nm may be twice or more than the respective transmittances of the display device of Comparative Examples 1 and 2.

The aspects described herein provide the display panel 110 and display device 100 capable of reducing a size of the non-display area NDA of the display panel 110, and enabling the optical electronic devices (11, 12) not to be exposed in the front surface of the display device 100 by locating the optical electronic devices (11, 12) such as a camera, a sensor, and the like under, at a lower portion of, the display area DA of the display panel 110.

The aspects described herein provide the display panel 110 and the display device 100 having the light transmission structure for enabling the optical electronic device under the display area, or at a lower portion, of the display panel to normally receive light transmitting the display panel.

According to the aspects described herein, the display panel may include the display area including the first optical area OA1 including the plurality of light emitting areas and the plurality of first transmissive areas TA1, and the non-optical area NA located outside of the first optical area OA1 and including the plurality of light emitting areas, and the non-display area.

The display device may include the first optical electronic device 11 located under, at a lower portion of the display panel and overlapping with at least a portion of the first optical area OA1 included in the display area. The display panel may include the first substrate SUB1 disposed in at least a portion of the non-optical area N, the second substrate SUB2 disposed on the first substrate, the third substrate SUB3 disposed in the first optical area OA1 and having a higher transmittance than the first and second substrates SUB1 and SUB2, and the first bonding layer 650 disposed on at least one surface of the third substrate SUB3.

The first bonding layer 650 may be disposed on the whole of one or more side surfaces of the third substrate SUB3. Further, the first bonding layer 650 may be disposed on the whole of the top surface of the third substrate SUB3.

The material of the first bonding layer 650 may include an amino group.

The material of the third substrate SUB3 may be different from respective materials of the first and second substrates SUB1 and SUB2.

At least a portion of the first bonding layer 650 may be coupled to at least a portion of respective at least one side surface of the first and second substrates SUB1 and SUB2.

An area in which the first and second substrates SUB1 and SUB2 and the first bonding layer 650 are coupled may be disposed in the non-optical area NA.

The display device may include an interlayer insulating layer IPD disposed between the first substrate SUB1 and the second substrate SUB2. The sum of respective heights of the first substrate SUB1, the interlayer insulating layer IPD, and the second substrate SUB1 may correspond to or be greater than the height of the third substrate SUB1.

One side of the interlayer insulating layer IPD may contact the first bonding layer 650.

The maximum width of the third substrate SUB3 may correspond to, or greater than, the maximum width of the first optical area OA1. The maximum widths of the third substrate SUB3 and the first optical area OA1 may refer to widths in a direction of the longest length of the display panel or a direction that intersects the direction of the longest length of the display panel.

The third substrate SUB3 may also be disposed in at least a portion of the second optical area OA2.

The area of the first bonding layer 650 coupled to respective at least one side of the first and second substrates SUB1 and SUB2 may be disposed in at least a portion of the second optical area OA2 or disposed in the non-optical area NA.

The aspects described herein provide the display pane with the structure of having high transmittance and excellent heat resistance in the area where the optical electronic device is disposed, and in turn, not causing a process defect even in a subsequent process, and the display device including the display panel.

The above description has been presented to enable any person skilled in the art to make and use the technical idea of the present disclosure, and has been provided in the context of a particular application and its requirements. Various modifications, additions and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A display device, comprising:
a display panel comprising a display area and a non-display area, wherein the display area includes a first optical area having a plurality of first light emitting areas and a plurality of first transmission areas, and a non-optical area having a plurality of second light emitting areas located outside of the first optical area; and
a first optical electronic device located under the display panel and overlapping with at least a portion of the first optical area included in the display area,
wherein the display panel further comprises:
a base substrate disposed in at least a portion of the non-optical area;
a third substrate disposed in the first optical area and having a transmittance higher than the base substrate; and
a bonding layer disposed on at least one side surface of the third substrate,
wherein at least a portion of the bonding layer is coupled to at least a portion of at least one side surface of the base substrate,
wherein an area in which the base substrate is coupled to the bonding layer is disposed in the non-optical area, and
wherein the base substrate includes a first substrate and a second substrate disposed on the first substrate.

2. The display device according to claim 1, wherein the bonding layer is disposed on all side surfaces of the third substrate, and disposed on an entire top surface of the third substrate.

3. The display device according to claim 1, wherein a material of the bonding layer includes an amino group.

4. The display device according to claim 1, wherein a material of the third substrate is different from a material of the base substrate, wherein the base substrate includes polyimide, and the third substrate includes glass.

5. The display device according to claim 1, wherein the base substrate further comprises an interlayer insulating layer disposed between the first substrate and the second substrate,
wherein a sum of heights of the first substrate, the interlayer insulating layer and the second substrate is the same as or greater than a height of the third substrate, wherein at least one side surface of the interlayer insulating layer contacts the bonding layer.

6. The display device according to claim 1, wherein a width of the third substrate is the same as or greater than a width of the first optical area.

7. The display device according to claim 1, wherein the number of sub-pixels per unit area in the first optical area is less than the number of sub-pixels per unit area in the non-optical area.

8. The display device according to claim 1, wherein the display area further comprises a second optical area different from the first optical area and the non-optical area, and
wherein the display device further comprises a second optical electronic device located under the display panel and overlapping with at least a portion of the second optical area.

9. The display device according to claim 8, wherein the third substrate is disposed in at least a portion of the second optical area, wherein an area of the bonding layer coupled to the base substrate is disposed in at least a portion of the second optical area or disposed in the non-optical area.

10. The display device according to claim 8, wherein the first optical electronic device is a camera, and the second optical electronic device is a sensor.

11. The display device according to claim 1, wherein the display panel further comprises a cathode electrode disposed in the plurality of second light emitting areas and the plurality of first light emitting areas included in the non-optical area and the first optical area and not disposed in the plurality of first transmission areas in the first optical area.

12. The display device according to claim 1, wherein the display panel further comprises a light shield layer disposed under transistors in the plurality of second light emitting areas and not disposed in the plurality of first transmission areas.

13. The display device according to claim 1, wherein the display panel further comprises gate lines run through the first optical area by avoiding the plurality of first transmission areas in the first optical area, wherein the display panel further comprises gate lines running through the first optical area includes one or more bent portions running around outer edges of one or more of the plurality of first transmission areas.

14. The display device according to claim 1, wherein the display panel further comprises gate lines running through the first optical area and gate lines not running through the first optical area have different lengths.

15. The display device according to claim 1, wherein the number of subpixels connected to one or more of gate lines in the display panel running through the first optical area is different from the number of subpixels connected to each of gate lines in the display panel not running through the first optical area.

16. The display device according to claim 1, wherein an area of touch sensor metal per unit area in the first optical area is smaller than an area of touch sensor metal per unit area in the non-optical area.

17. A substrate for a display panel comprising a display area and a non-display area, comprising:
a base substrate;
a third substrate having a transmittance higher than the base substrate;
a bonding layer disposed on at least one side surface of the third substrate for bonding the base substrate and the third substrate,
wherein the base substrate includes polyimide, and the third substrate includes glass,
wherein a material of the bonding layer includes an amino group, and
wherein at least a portion of the bonding layer is coupled to at least a portion of at least one side surface of the base substrate, wherein the display area includes a first optical area having a plurality of the first light emitting areas and a plurality of first transmission areas, and a non-optical area having a plurality of the second light emitting areas located outside of the first optical area;

wherein an area in which the base substrate is coupled to the bonding layer is disposed in the non-optical area, and wherein the base substrate includes a first substrate and a second substrate disposed on the first substrate.

18. The substrate according to claim 17, wherein an interlayer insulating layer disposed between the first substrate and the second substrate, and wherein a sum of heights of the first substrate, the interlayer insulating layer, and the second substrate is the same as or greater than a height of the third substrate.

\* \* \* \* \*